US007986250B2

(12) United States Patent
Galton et al.

(10) Patent No.: US 7,986,250 B2
(45) Date of Patent: Jul. 26, 2011

(54) NONLINEARITY ROBUST SUCCESSIVE REQUANTIZER

(75) Inventors: Ian Galton, Del Mar, CA (US); Ashok Swaminathan, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/579,899

(22) Filed: Oct. 15, 2009

(65) Prior Publication Data

US 2010/0166084 A1      Jul. 1, 2010

Related U.S. Application Data

(60) Provisional application No. 61/105,635, filed on Oct. 15, 2008.

(51) Int. Cl.
*H03M 7/00* (2006.01)
*H03M 3/00* (2006.01)
(52) U.S. Cl. ............ 341/50; 341/51; 341/143; 341/200
(58) Field of Classification Search .................. 341/143, 341/50, 51, 200
See application file for complete search history.

(56) References Cited

U.S. PATENT DOCUMENTS

| 6,894,632 | B1 * | 5/2005 | Robinson ...................... | 341/143 |
|---|---|---|---|---|
| 7,602,323 | B2 | 10/2009 | Galton et al. | |
| 2005/0162295 | A1 * | 7/2005 | Dias et al. ...................... | 341/143 |
| 2005/0206543 | A1 * | 9/2005 | Draxelmayr .................. | 341/143 |
| 2007/0194855 | A1 * | 8/2007 | Mitteregger .................. | 330/302 |

OTHER PUBLICATIONS

Aach et al., "Bayesian algorithms for adaptive change detection in image sequences using Markov random fields", Signal Image Communication, pp. 147-160, (1995).[*
Chou, et. al., "Dithering and Its Effects on Sigma-Delta and Multi-stage Sigma-Delta Modulation", *IEEE Transactions on Information Theory*, vol. 37, No. 3, p. 500-513, May 1991.
Daubechies et. al., "Approximating a Bandlimited Function Using Very Coarsely Quantized Data: A Family of Stable Sigma-Delta Modulators of Arbitrary Order", *The Annals of Mathematics, Second Series*, vol. 158, No. 2, 679-710, Sep. 2003.
De Muer, Brian et. al., "A CMOS Monolithic ΔΣ-Controlled Fractional Frequency Synthesizer for DCS-1800", *IEEE Journal of Solid-State Circuits*, vol. 37, No. 7, Jul. 2002.
Fogleman, Eric et. al., "A Digital Common-Mode Rejection Technique Differential Analog-to-Digital Conversion", *IEEE Transactions on Circuits and Systems-II: Analog and Digital Signal Processing*, vol. 48, No. 3, Mar. 2001.

(Continued)

*Primary Examiner* — Jean B Jeanglaude
(74) *Attorney, Agent, or Firm* — Greer, Burns & Crain Ltd.

(57) ABSTRACT

A successive requantizer, which serves as a replacement for a ΔΣ modulator in a fractional-N PLL or a DAC, and avoids spurious tone problems, thereby circumventing the tradeoffs that result from reliance on the common approach of making highly linear analog circuitry to avoid spurious tones. A successive requantizer fractional-N PLL of the invention has the potential to reduce power consumption and the cost of commercial communication devices. The successive requantizer performs digital quantization one bit at a time in such a way that the quantization noise can he engineered to have desirable properties such as non-linearity robustness. The successive requantizer is applicable to most high-performance digital communication systems, such as cellular telephone handsets and wireless local and metropolitan area network transceivers.

16 Claims, 5 Drawing Sheets

OTHER PUBLICATIONS

Galton, Ian, "Spectral Shaping of Circuit Errors in Digital-to-Analog Convertors", *IEEE Transactions of Circuits and Systems-II: Analog and Digital Signal Processing*, vol. 44, No. 10, Oct. 1997.

Galton, Ian, "Delta-Sigma Data Conversion in Wireless Transceivers", *IEEE Transactions on Microwave Theory and Techniques*, vol. 50, No. 1, Jan. 2002.

Gray, Robert M. et. al., "Dithered Quantizers", *IEEE Transactions on Information Theory*, vol. 39, No. 3, May 1993.

Gupta, Manoj et. al., "A 1.8-GHz Spur-Cancelled Fractional-$N$ Frequency Synthesizer With LMS-Based DAC Gain Calibration", *IEEE Journal of Solid-State Circuits*, vol. 41, No. 12, Dec. 2006.

Magrath, A.J. et. al., "Efficient dithering of sigma-delta modulators with adoptive bit flipping", *Electronic Letters*, vol. 31, No. 11, May 25, 1995.

Marcus, Brian et. al., "On Codes with Spectral Nulls at Rational Submultiples of the Symbol Frequency", *IEEE Transactions on Information Theory*, vol. IT-33, No. 4, Jul. 1957.

Meninger, Scott E. et. al., "A 1-MHZ Bandwidth 3.6-GHz 0.18-μm CMOS Fractional-N Synthesizer Utilizing a Hybrid PFD/DAC Structure for Reduced Broadband Phase Noise", *IEEE Journal of Solid-State Circuits*, vol. 41, No. 4, Apr. 2006.

Miller, Brian et. al. "A Multiple Modulator Fractional Divider", *Forty-Fourth Annual Symposium on Frequency Control*, May 23-25, 1990, Baltimore, MD.

Miller, Brian et. al, "A Multiple Modulator Fractional Divider", *IEEE Transactions on Instrumentation and Measurement*, vol. 40, No. 3, Jun. 1991.

Pamarti, Sudhakar, et. al., "A Wideband 2.4-GHz Delta-Sigma Fractional-$N$ PLL With 1-Mb/s In-Loop Modulation", *IEEE Journal of Solid-State Circuits*, vol. 39, No. 1, Jan. 2004.

Pamarti, Sudhakar, et. al., "Statistics of the Quantization Noise in 1-Bit Dithered Single-Quantizer Digital Delta-Sigma Modulators", *IEEE Transaction on Circuits and Systems-I: Regular Ppaers*, vol. 54, No. 3, Mar. 2007.

Pierobon, Gianfranco, L., "Codes for Zero Spectral Density at Zero Frequency", *IEEE Transactions on Information Theory*, vol. IT-30, No. 2, Mar. 1984.

Quevedo, Daniel E. et. al., "Multistep Optimal Analog-to-Digital Conversion", *IEEE Transactions on Circuits and Systems-I: Regular Papers*, vol. 52, No. 3, Mar. 2005.

Riley, Tom A. et. al., "Delta-Sigma Modulation in Fractional-$N$ Frequency Synthesis", *IEEE Journal of Solid-State Circuits*, vol. 28, No. 5, May 1993.

Swaminathan, Ashok et. al., "A Wide-Bandwidth 2.4GHz ISM-Band Fractional-N PLL with Adaptive Phase-Noise Cancellation", *IEEE International Solid-State Circuits Conference*, Feb. 13, 2007.

Temporiti, Enrico et. al., "A 700-kHz Bandwidth $\Sigma\Delta$ Fractional Synthesizer With Spurs Compensation and Linearization Techniques for WCDMA Applications", *IEEE Journal of Solid-State Circuits*, vol. 39, No. 9, Sep. 2004.

Wang, Kevin J. et. al., "Spurious-Tone Suppression Techniques Applied to a Wide-Bandwidth 2.4GHz Fractional-$N$ PLL". *IEEE International Solid-State Circuits Conference*, Feb. 5, 2008.

Welz, Jared et. al., "Simplified Logic for First-Order and Second-Order Mismatch-Shaping Digital-to-Analog Convertor", *IEEE Transactions on Circuits and Systems-II: Analog and Digital Signal Processing*, vol. 48, No. 11, Nov. 2001.

Welz, Jared et. al., "A Tight Signal-Band Power Bound on Mismatch Noise in a Mismatch-Shaping Digital-to-Analog Convertor", *IEEE Transactions on Information Theory*, vol. 50, No. 4, Apr. 2004.

Yu, Shiang-Hwua, "Noise-Shaping Coding Through Bounding the Frequency-Weighted Reconstruction Error", *IEEE Transactions on Circuits and Systems-II: Express Briefs*, vol. 53, No. 1, Jan. 2006.

\* cited by examiner

NONLINEARITY ROBUST SUCCESSIVE REQUANTIZER

PRIORITY CLAIM AND REFERENCE TO RELATED APPLICATION

The application claims priority under 35 U.S.C. §119 from prior provisional application Ser. No. 61/105,635, which was filed on Oct. 15, 2008.

STATEMENT OF GOVERNMENT INTEREST

This invention was made with government support under Contract No. CCF0515286 awarded by National Science Foundation. The government has certain rights in the invention.

FIELD

A field of the invention is wireless communications. Another field of the invention is digital to analog converters. Example applications of the invention include high-performance digital communication systems such as cellular telephone handsets and wireless local and metropolitan area network transceivers.

BACKGROUND

Virtually all wireless communication systems require local oscillators for up-conversion and down-conversion of their transmitted and received signals. Most commonly, the local oscillators are implemented as fractional-N PLLs (phase locked loops). Fractional-N PLLs can generate a high quality, high frequency signal from a digital input stream and a lower frequency reference waveform.

The spectral purity of the local oscillator in a transceiver is a critical factor in overall transceiver performance. Communication standards therefore explicitly or implicitly stipulate stringent phase noise requirements on the local oscillators. Most standards dictate the maximum acceptable phase noise power in various frequency bands. Additionally, most standards require that spurious tones in the local oscillator's phase noise be highly attenuated, particularly in critical frequency bands. DACs also have stringent spurious tone requirements in wireless applications, digital audio applications and instrumentation applications. Digital audio and instrumentation spurious tone requirements are particularly critical in many consumer products.

Modern digital-to-analog converters (DACs) and fractional-N phase-locked loops (PLLs) rely upon a digital delta-sigma modulator (ΔΣ modulator) to coarsely quantize a constant or slowly varying digital sequence. The quantized sequence can be viewed as the sum of the original sequence plus spectrally shaped quantization noise that has most of its power outside of a given low-frequency signal band. Ultimately, the quantized sequence is converted to an analog signal and further processed by analog circuitry including a low-pass filter to suppress quantization noise outside of the signal band.

FIG. 1 is a block diagram of a conventional ΔΣ fractional-N PLL. The purpose of the system is to generate an output signal of frequency $(N+\alpha)f_{ref}$ where N is a positive integer, a is a constant fractional value between 0 and 1, and $f_{ref}$ is the frequency of a reference oscillator. The system consists of a phase-frequency detector (PFD) and a charge pump 100, a loop filter 102, a voltage controlled oscillator (VCO) 104, a multi-modulus divider 106, and a digital ΔΣ modulator 108.

The divider output, $v_{div}(t)$, is a two-level signal in which the nth and (n+1)th rising edges are separated by N+y[n] periods of the VCO output, for n=1, 2, 3, . . . , where y[n] is a sequence of integers generated by the ΔΣ modulator 108. As indicated in FIG. 1B for the case where the PLL is locked, if the nth rising edge of the reference signal, $v_{ref}(t)$, occurs before that of $v_{div}(t)$, the charge pump 100 generates a positive current pulse of magnitude $1_{CP}$ with a duration equal to the time difference between the two edges. This increases the VCO control voltage; $v_{ctrl}(t)$, thereby increasing the VCO output frequency. Alternatively, if the nth rising edge of $v_{ref}(t)$, occurs after that of $v_{div}(t)$, the situation is similar except the polarity of the current pulse is negative, which decreases the VCO frequency. This causes the output frequency to settle to $f_{ref}$ times the sum of N and the average of y[n].

If y[n] could be set directly to the desired fractional value, a, directly then the output frequency of the PLL would settle to $(N+\alpha)f_{ref}$, thereby achieving the goal of the fractional-N PLL. Unfortunately, y[n] is restricted to integer values because the divider 106 is only able to count integer VCO cycles whereas a is a fractional value. To circumvent this problem y[n] is designed to be a sequence of integers that average to α. The input to the ΔΣ modulator 108 is α plus pseudo-random least significant bit (LSB) dither, so its output has the form y[n]=α+s[n], where s[n] is a zero-mean sequence consisting of spectrally shaped ΔΣ quantization noise and LSB dither. The dither prevents s[n] from containing spurious tones that would otherwise show up as spurious tones in the PLL's output. Hence, the output frequency settles to an average $(N+\alpha)f_{ref}$ as desired, although s[n] introduces phase noise.

For most wireless applications spurious tones can be sufficiently suppressed only with design tradeoffs that significantly degrade other aspects of performance. This is particularly problematic in fractional-N PLLs wherein the input to the modulator usually is a constant and the output sequence from the modulator is converted to analog form and subjected to various nonlinear operations because of nonideal circuit behavior. The common approach to address spurious tones is to make the analog circuitry very linear so that the spurious tones have sufficiently low power for the given application. This limits design options and results in higher analog circuit power consumption than would be required if fewer linear analog circuits could be tolerated.

The tradeoffs tend to increase power consumption and circuit area, limit the choice of reference frequencies, and dictate low PLL bandwidths which preclude on-chip loop filters. They also become less effective in system-on-chip designs as CMOS circuit technology is scaled into the sub-100 nanometer regime. Therefore, the spurious tone problem negatively affects power consumption, cost, and manufacturability of wireless transceivers, and the problem gets worse as CMOS circuit technology scales with Moore's Law.

To address the quantization noise, researchers have described methods of implementing noise-shaped quantizers. See, e.g., A. J. Magrath and M. B. Sandler, "Efficient Dithering of Sigma-delta Modulators with Adaptive bit Flipping," Electron. Lett, vol. 31, no. 11, pp. 846-847, May 1995; S. H. Yu, "Noise-Shaping Coding through Bounding the Frequency Weighted Reconstruction Error," IEEE Trans. Circuits Syst. II: Expr. Briefs, vol. 53, no. 1, pp. 67-71, January 2006; D. E. Quevedo and G. C. Goodwin, "Multistep Optimal Analog-to-Digital Conversion," *IEEE Trans. Circuits and Systems I: Regular Papers*, vol. 52,no. 3, pp. 503-515, March 2005; I. Daubechies and R. DeVore, "Approximating a Band-limited Function Using Very Coarsely Quantized Data: A Family of Stable Sigma Delta Modulators of Arbitrary Order," *Ann. Math.*, vol. 158, no. 2, pp. 679-710, 2003.

Generally, known phase noise cancelling fractional-N PLLs are effective to cancel phase noises that result from mismatches between positive and negative current sources in the charge pump. However, these methods specifically focus on stabilizing noise-shaped coders and do not address the effect of nonlinearities on the quantization error.

SUMMARY OF THE INVENTION

An embodiment of the invention is a successive requantizer, which serves as a replacement for a $\Delta\Sigma$ modulator in a fractional-N PLL or DAC, and avoids the above-mentioned spurious tone problem, thereby circumventing the tradeoffs that result from reliance on common approach of making highly linear analog circuitry to avoid spurious tones. A successive requantizer fractional-N PLL of the invention has the potential to reduce power consumption and the cost of commercial communication devices. A successive requantizer of the invention performs digital quantization one bit at a time in such a way that the quantization noise can be engineered to have desirable properties such as non-linearity robustness. The invention is applicable to most high-performance digital communication systems, such as cellular telephone handsets and wireless local and metropolitan area network transceivers.

DETAILED DESCRIPTION OF THE PREFERRED EMBODIMENTS

Figure 1A:
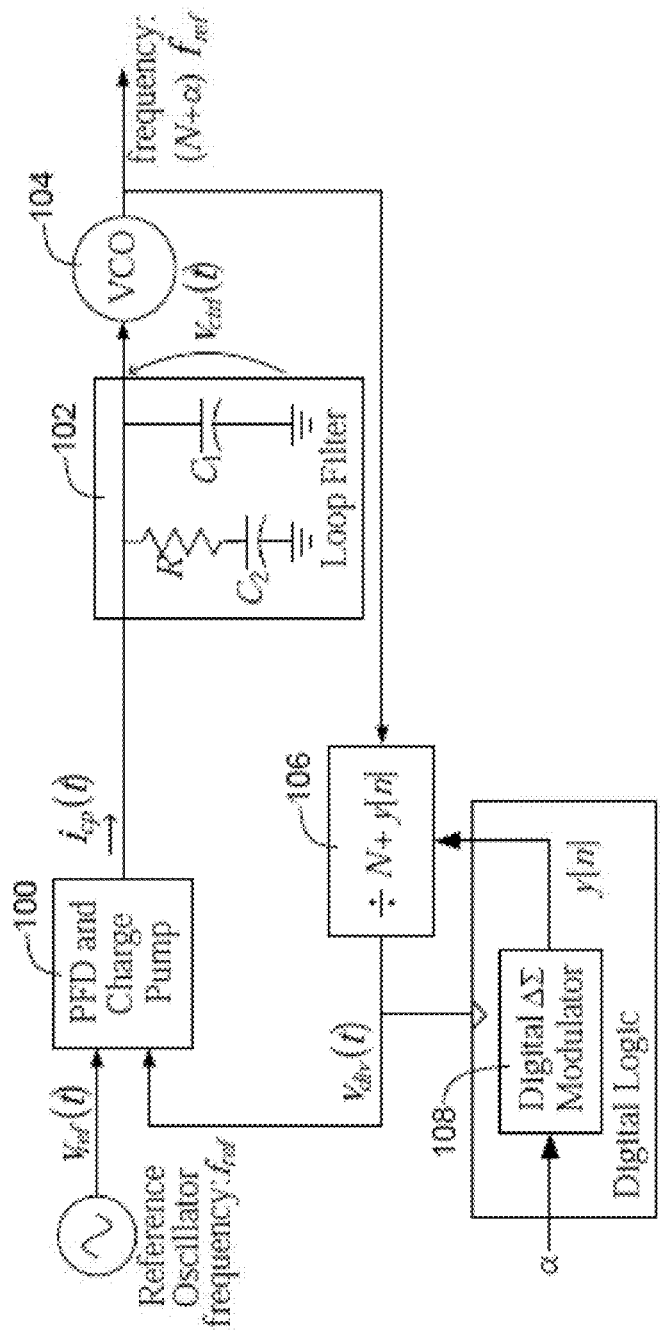
FIG. 1A (prior art) is a block diagram of a fractional-N PLL.
Figure 1B:
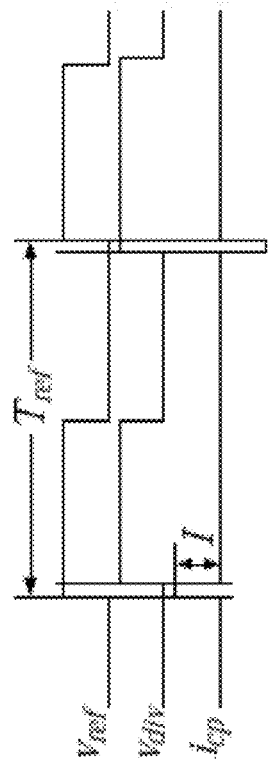
FIG. 1B illustrates waveforms in the PLL of FIG. 1A.

It is critical spurious tones in the noise introduced by DACs and fractional-N PLLs have very low power. Unfortunately, spurious tones are inevitable in the phase noise of fractional-N PLLs. In principle, dither applied to a modulator can prevent the quantization noise from containing any spurious tones whatsoever. In practice, digital delta sigma modulators are major sources of spurious tones in oversampling DACs and fractional-N PLLs and are believed by the present inventors to give rise to spurious tones whenever their quantization noise is subjected to nonlinear distortion.

The present invention identifies and addresses a surprising fundamental source of spurious tones in fractional-N PLLs, namely, the digital $\Delta\Sigma$ modulator. The fractional-N PLL is identified as the fundamental source of spurious tones in the PLL's phase noise. This is true even when dither is used to prevent spurious tones in the $\Delta\Sigma$ modulator's quantization noise. Regardless of how dither is applied, spurious tones are induced when the $\Delta\Sigma$ modulator's quantization noise is subjected to non-linear distortion. In a typical $\Delta\Sigma$ modulator used in a fractional-N PLL, the interaction of the constant input and the modulator's first accumulator gives rise to hidden periodicities. Dither provides sufficient randomness to avoid spurious tones in y[n], but not to avoid spurious tones when s[n] is subjected to nonlinear distortion.

This is particularly problematic in fractional-N PLLs wherein the output sequence from the $\Delta\Sigma$ modulator is converted to analog form and subjected to various non-linear operations because of non-ideal circuit behavior. In embodiments of the invention, a successive requantizer replaces the $\Delta\Sigma$ modulator and avoids the spurious tone problems. The successive requantizer can also serve as a replacement for a $\Delta\Sigma$ modulator in digital analog converter, and example embodiment DACs take the same form as a fractional-N PLL.

An embodiment of the invention is a successive requantizer, which serves as a replacement for a $\Delta\Sigma$ modulator in a fractional-N PLL, and avoids the above-mentioned spurious tone problem, thereby circumventing the tradeoffs that result from reliance on common approach of making highly linear analog circuitry to avoid spurious tones. A successive requantizer fractional-N PLL or DAC of the invention has the potential to reduce power consumption and the cost of commercial communication devices. A successive requantizer of the invention to performs digital quantization one bit at a time in such a way that the quantization noise can be engineered to have desirable properties such as non-linearity robustness. The invention is applicable to most high-performance digital communication systems, such as cellular telephone handsets and wireless local and metropolitan area network transceivers.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

Fractional-N PLLs used in communications applications and DACs using $\Delta\Sigma$ modulators ultimately generate analog waveforms. Each such waveform contains components corresponding to digitally generated quantization noise, s[n], and, in the case of fractional-N PLLs, its running sum, $$t[n] = \sum_{k=0}^{n} s[k]. \tag{1}$$

Inevitable non-ideal analog circuit behavior causes non-linear distortion. The distortion can be any non-linear function, but for almost all practical applications can be represented by a memory-less, truncated power series. This gives rise to components in the output waveform corresponding to $s^p[n]$ for p=1, 2, 3, ..., $h_s$, and $t^p[n]$ for p=1, 2, 3, ..., $h_t$, where $h_s$, and $h_t$ are the highest significant orders of distortion for the given application applied on s[n] and t[n] respectively.

Most communication system standards specify required performance in terms of quantities that can be measured using spectrum analyzers, so the properties of the waveforms typically are quantified in the laboratory using spectrum analyzers. Although the waveforms themselves are considered to be random processes in most cases, spectrum analyzers can only average over time, not over ensemble. Therefore, in such applications the properties of the periodograms of $s^p[n]$ and $t^p[n]$ given by $$I_{s^p,L}(\omega) = \frac{1}{L}\left|\sum_{n=0}^{L-1} s^p[n]e^{-j\omega n}\right|^2 \qquad (2)$$

and $$I_{t^p,L}(\omega) = \frac{1}{L}\left|\sum_{n=0}^{L-1} t^p[n]e^{-j\omega n}\right|^2 \qquad (3)$$

are of particular interest, rather than traditional power spectral density (PSD) functions. It is well known that in certain cases the expected values of the periodograms converge to the true PSD functions in the limit as $L \to \infty$, but in the applications mentioned above this is not a requirement, or even relevant to the measured performance. The successive requantization of the invention can be understood with respect to the properties of the periodograms given by (2) and (3).

Preferred Embodiment Successive Requantizer and PLL

Figure 2A:
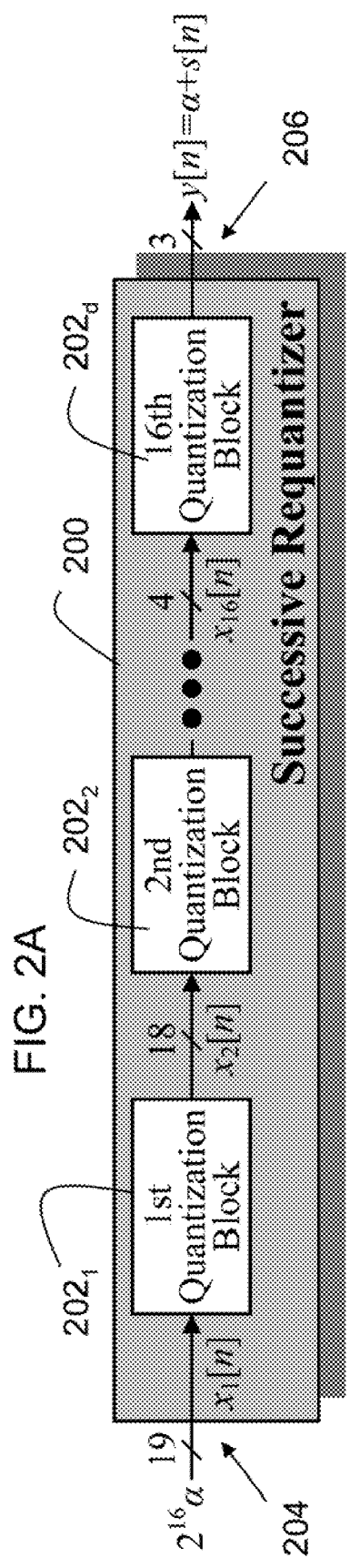
FIG. 2A is a block diagram of a preferred embodiment successive requantizer for a fractional-N PLL or DAC.

FIG. 2A illustrates a preferred embodiment successive requantizer that can replace a $\Delta\Sigma$ modulator, such as the $\Delta\Sigma$ modulator 108 in the FIG. 1A fractional-N PLL. The fractional-N PLL of FIG. 1A as modified by the successive requantizer of FIG. 2A is a type of DAC, as it converts a digital sequence to an analog output. The successive requantizer of FIG. 2A readily serves as the replacement for any converter that uses a delta sigma modulator. The bit sequences illustrated are examples only, and the number of quantization blocks $202_1$-$202_d$ will depend upon the number of bits in the input bit sequences and the desired number of bits in the output sequence. The successive requantizer 200 illustrated in FIG. 2A quantizes a 19-bit input sequence received at its input 204 by 16 bits (using 16 quantization blocks 202) to generate a 3-bit output sequence at its output 206.

The input 204 and output 206 of the successive requantizer 200 are integer-valued. For the fractional-N PLL application, the goal is to quantize $\alpha$, which is a fractional value between 0 and 1, and in this design a is taken to be a constant multiple of $2^{-16}$. Therefore, a is scaled by $2^{16}$ prior to the successive requantizer to convert it into an integer. As explained below, the 3-bit integer-valued output of the successive requantizer is $y[n]=\alpha+s[n]$, where $s[n]$ is quantization noise. While the example assumes that each quantization block quantizes its input sequence by one bit, the quantization blocks can quantize their inputs by more than one bit, as will be appreciated by artisans.

Figure 2B:
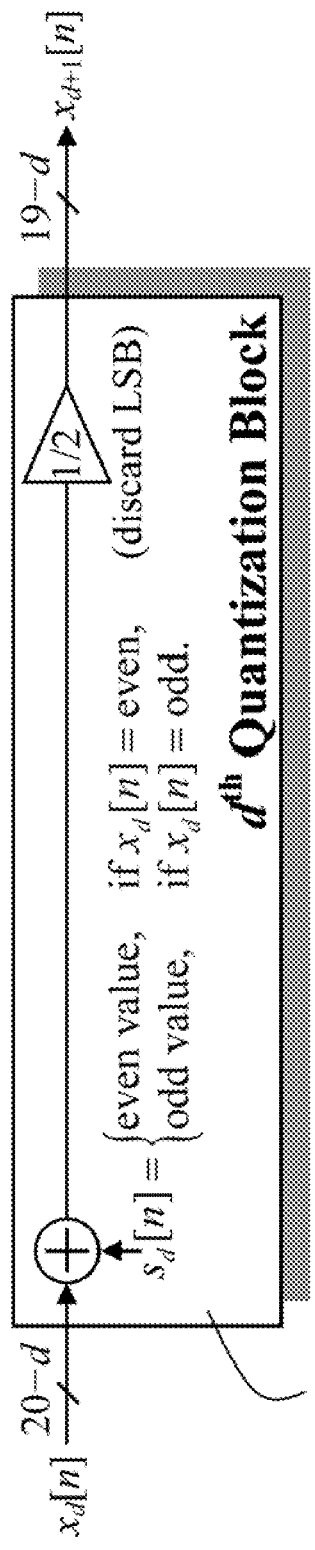
FIG. 2B illustrates the general form of a preferred embodiment quantization block in the successive requantizer of FIG. 2A in which all variables are integer-valued two's complement numbers.

As shown in FIG. 2B each quantization stage/block $202_d$ simultaneously halves its input and quantizes the result by one bit every sample period. The output of the dth quantization block $202_d$ is $x_{d+1}[n]=(x_d[n]+s_d[n])/2$, where $s_d[n]$ a sequence generated within the quantization block. At each time n, $s_d[n]$ is chosen such that $x_d[n]+s_d[n]$ does not exceed the range of a (20-d)-bit (calculated by 4+N-d, where N is the number of quantization blocks) two's complement integer, and the parity of $s_d[n]$ is the same as that of $x_d[n]$. The range can be generally stated as (K-d)-bit two's complement integer, where the parity of $s_d[n]$ is the same as that of $x_d[n]$, where K is determined by the number of quantization stages, the number of bits quantized per stage, and the logic which generates $s_d[n]$.

The parity restriction ensures that $x_d[n]+s_d[n]$ is an even number so its LSB is zero. Discarding the LSB simultaneously halves the quantization block's input value and quantizes the result by one bit. The resulting quantization noise is $s_d[n]/2$, so the successive requantizer's overall quantization noise is $$s[n] = \sum_{d=1}^{16} 2^{d-17} s_d[n], \qquad (4)(i)$$

which can be generalized to $$s[n] = \sum_{d=0}^{K-1} 2^d s_d[n]. \qquad (4)(ii)$$

Therefore, $s[n]$ is a linear combination of the $s_d[n]$ sequences, so it inherits the properties of the $s_d[n]$ sequences.

Figure 2C:
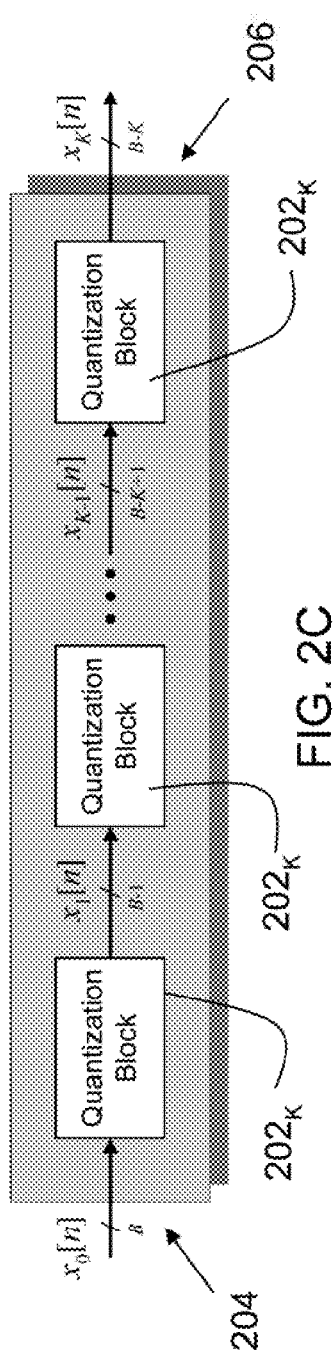
FIGS. 2C-2E illustrates detail on the sequence generation of the successive requantizer of FIGS. 2A-2B.
Figure 2D:
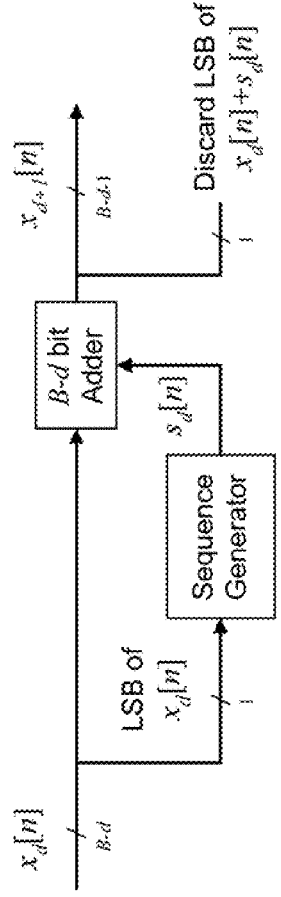
Figure 2E:
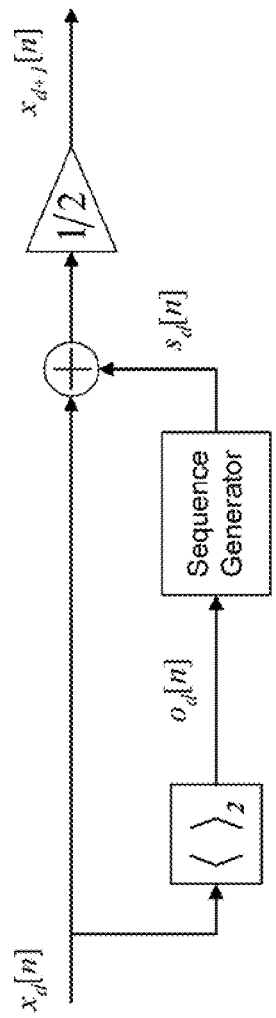

The example presented in (4)(i) is for a specific number of input bits and quantization but can be generalized as in (4)(ii) for different numbers of input bits and different numbers of bit quantizations. Generalized for an input that is a sequence of B-bit numbers, $x_0[n]$, and an output that is a sequence of B-K-bit numbers, $x_K[n]$, where $n=0, 1, 2, \ldots$, is the time index of the sequences. The generalization is shown in FIGS. 2C-2E. The successive requantizer then consists of K quantization blocks $202_K$, each of which quantizes its input by one bit, so the successive requantizer quantizes K bits overall. Each quantization block generates a quantization sequence, $s_d[n]$, with the property that $x_d[n]+s_d[n]$ is an even number for each n, where $x_d[n]$ is the quantization block's input sequence. The quantization block adds $s_d[n]$ to $x_d[n]$ and discards the least significant bit (LSB) to implement the 1-bit quantization. Without loss of generality, numbers within the successive requantizer are taken to be integers with a two's-compliment binary number representation. Since $x_d[n]+s_d[n]$ is an even number for each n, its LSB is zero, so discarding the LSB does not incur a truncation error. Hence, the quantization noise of the successive requantizer is a weighted sum of the $s_d[n]$ sequences.

The properties of the quantization noise $s[n]$ can be engineered by appropriate design of the $s_d[n]$ sequences. So far, the only restriction on the $s_d[n]$ sequences is that $x_d[n]+s_d[n]$ must be an even integer for each n and d. In the example successive requantizer 200 this restriction on the $s_d[n]$ sequences is that they must be chosen such that $x_d[n]+s_d[n]$ is a (20-d)-bit two's complement even integer for each n and d. This leaves considerable flexibility in the design of the $s_d[n]$ sequences, which can be exploited to achieve the desired quantization noise properties.

The successive requantizer partially exploits this flexibility to ensure that the running sum of each $s_d[n]$ sequence, i.e., $$t_d[n] = \sum_{k=0}^{n} s_d[k], \qquad (5)$$

is bounded for all n, and each $s_d[n]$ has a smooth PSD (power spectral density) that increases monotonically with frequency. This implies that $s[n]$ is highpass shaped quantization noise that is free of spurious tones and the PSD of $s[n]$ is zero at $\omega=0$.

This still leaves flexibility in the design of the $s_d[n]$ sequences which can exploited as described below to ensure that the sequences $(s[n])^p$ for $p=1, 2, 3, 4, 5$, and $(t[n])^p$ for $p=1, 2, 3$, are free of spurious tones, where $t[n]$ is the running sum of $s[n]$ given by:

$$t[n] = \sum_{k=0}^{n} s[k]$$

The objective is to ensure that the successive requantizer's quantization noise does not introduce significant spurious tones when subjected to the degree of nonlinear distortion expected from the analog circuits within the PLL. Circuit simulations can be used during PLL design to verify that preventing spurious tones from occurring in the $(s[n])^p$ and $(t[n])^p$ sequences is sufficient to achieve this objective.

Figures 3A, 3B:
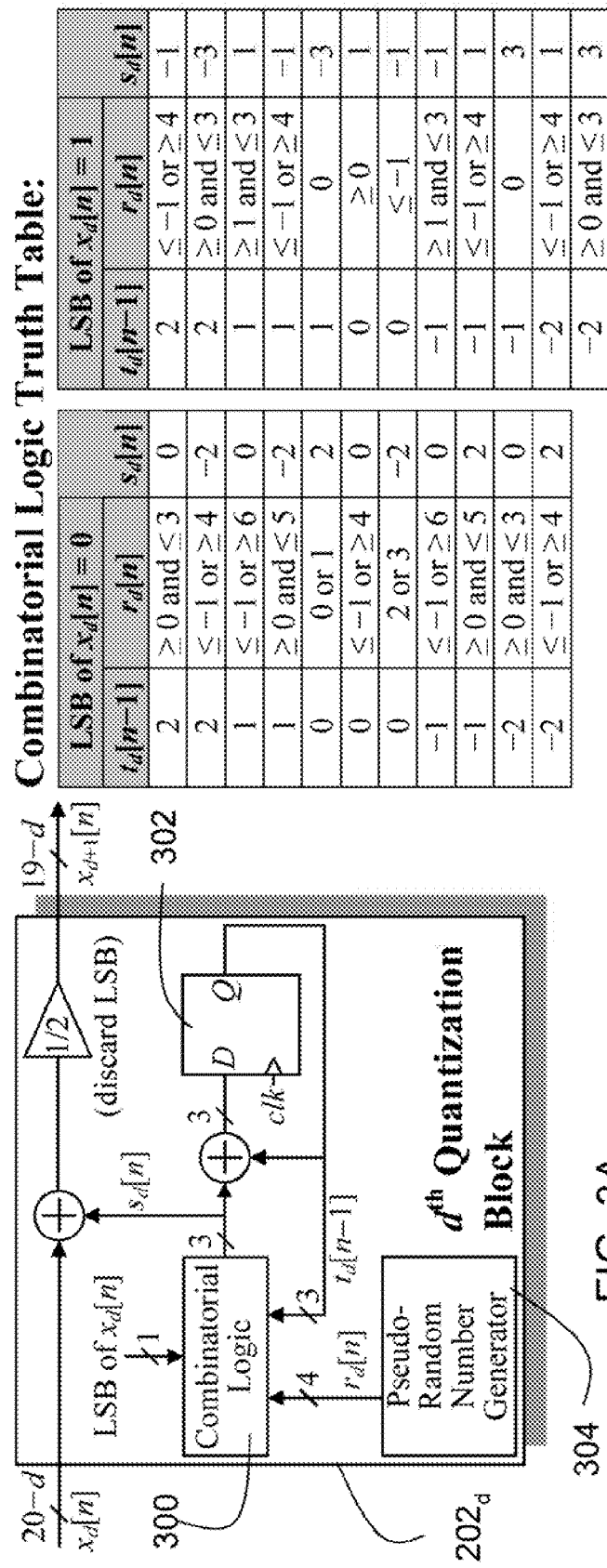
FIG. 3A is a block diagram that shows the register transfer level details of the dth quantization block of FIG. 2A.
FIG. 3B illustrates the combinatorial logic truth table of an example implementation of sequence generation logic.

FIG. 3A is a block diagram that shows the register transfer level details of the dth quantization block, and FIG. 3B illustrates the combinatorial logic truth table. There are many choices of sequences which can yield non-linear robust properties. The truth table of FIG. 3B illustrates one particular example. Each value of $s_d[n]$ is calculated via the combinatorial logic 300 as a function the previous value of $t_d[n]$ provided by D flip flop's 302, the parity of the current value of $x_d[n]$, and the current value of a 4 bit pseudo-random sequence (provided by pseudo random number generator 304), $r_d[n]$, where $\{r_d[n], d=1, 2, \ldots, 16, n=0, 1, 2, \ldots\}$ well-approximates independent identically distributed random variables. For this design the range of values taken on by $s_d[n]$ and $t_d[n]$ are $$s_d[n] \in \{-3, -2, -1, 0, 1, 2, 3\}, \text{ and } t_d[n] \in \{-2, -1, 0, 1, 2\}, \tag{6}$$

It can be verified that $t_d[n]$ is a discrete-valued Markov random sequence conditioned on the parity of $x_d[n]$. Whenever $x_d[n]$ is odd the one-step state transition matrix for $t_d[n]$ is given by $$A_o = [P\{t_d[n]=T_j | t_d[n-1]=T_i, o_d[n]=1\}]_{5 \times 5} \tag{7}$$

and whenever $x_d[n]$ is even the one-step state transition matrix for $t_d[n]$ is given by $$A_e = [P\{t_d[n]=T_j | [n-1]=T_i, o_d[n]=0\}]_{5 \times 5} \tag{8}$$

where $P\{X|Y\}$ denotes the conditional probability of event X given event Y, $o_d[n]$ is the LSB of $x_d[n]$, and $T_1=-2$, $T_2=-1$, $T_3=0$, $T_4=1$, $T_5=2$. The specific state transition matrices corresponding to the quantization block $202_d$ $$A_o = \begin{bmatrix} 0 & 3/4 & 0 & 1/4 & 0 \\ 3/16 & 0 & 3/4 & 0 & 1/16 \\ 0 & 1/2 & 0 & 1/2 & 0 \\ 1/16 & 0 & 3/4 & 0 & 3/16 \\ 0 & 1/4 & 0 & 3/4 & 0 \end{bmatrix} \tag{9}$$

and $$A_e = \begin{bmatrix} 1/4 & 0 & 3/4 & 0 & 0 \\ 0 & 5/8 & 0 & 3/8 & 0 \\ 1/8 & 0 & 3/4 & 0 & 1/8 \\ 0 & 3/8 & 0 & 5/8 & 0 \\ 0 & 0 & 3/4 & 0 & 1/4 \end{bmatrix}.$$

Details on the derivation of these state transition matrices are provided below in the successive quantization detail section. These state transition matrices ensure that the $(s[n])^p$ and $(t[n])^p$ sequences are free of spurious tones because each is a random process whose autocorrelation function converges to a constant as its time spread increases. Furthermore, the PSD of $s_d[n]$ has a zero at $\omega=0$ and increases at 6 dB per octave as $\omega$ increases from zero. In this respect, the quantization noise shaping of this version of the successive requantizer is comparable to that of a first-order $\Delta\Sigma$ modulator.

Successive requantizers with higher than first-order quantization noise shaping can also be designed. For example, second-order quantization noise shaping can be achieved by quantization blocks that calculate $s_d[n]$ as a function the running sum of $t_d[n]$ in addition to $t_d[n]$, a random sequence, and the parity of $x_d[n]$. However, the fractional-N PLL in this work is a phase noise cancelling fractional-N PLL, so higher than first-order shaping is not necessary because most of the quantization noise is removed prior to the loop filter via a DAC.

The running sums of each $t_{d,i}[n]$ sequence, i.e., $$t_{d,i}[n] = \sum_{k=0}^{n} t_{d,i-1}[k], \quad t_{d,1}[n] = \sum_{k=0}^{n} t_d[n] \tag{10}$$

can be bounded for all n, and each $t_{d,i}[n]$ has a smooth power spectral density that increases monotonically with frequency.

A tradeoff related to the quantization block $202_d$ in FIGS. 3A and 3B is that its reduced susceptibility to nonlinearity-induced spurious tones comes at the expense of increased quantization noise power. For example, if it is desired to have quantization noise with a first-order highpass spectral shape, but it is not necessary to prevent nonlinear distortion from inducing spurious tones in the quantization noise and its running sum, a quantization block that implements $$s_d[n] = \begin{cases} 0, & x_d[n] = \text{even} \\ r_d[n], & x_d[n] = \text{odd}, \quad t_d[n-1] = 0 \\ 1, & x_d[n] = \text{odd}, \quad t_d[n-1] = -1 \\ -1, & x_d[n] = \text{odd}, \quad t_d[n-1] = 1 \end{cases} \tag{11}$$

can be used, where $r_d[n]$ is an independent random sequence that takes on the values 1 and −1 with equal probability. In this case $s_d[n]$ takes on values of −1, 0, and 1, whereas the $t_d[n]$ generated by the quantization block of FIG. 3A takes on values of −1, 0, 1. Consequently, the power of the quantization noise from a quantization block based on (11) is significantly lower than that from the quantization block of FIG. 3A.

This example suggests what is believed to be a fundamental design tradeoff: reduced susceptibility to nonlinearity-induced spurious tones comes at the expense of increased quantization noise power. Increased quantization noise is unlikely to be a significant problem in phase noise cancelling fractional-N PLLs, but it is likely to be an issue in fractional-N PLLs that lack phase noise cancellation. Any particular design will benefit from analytical quantification of the tradeoff and its effect on the performance of a particular fractional-N PLL, and especially in the case of a PLL that lacks phase noise cancellation. Preferred embodiments of the invention use a phase noise cancelling PLL design, such as the design that is described in commonly owned U.S. patent application Ser. No. 12/352,293 ("the '293 application"), filed Jan. 12, 2009, and entitled Adaptive Phase Noise Cancellation for Fractional-N Phase Locked Loop (which application is incorporated by reference herein).

Figure 4:
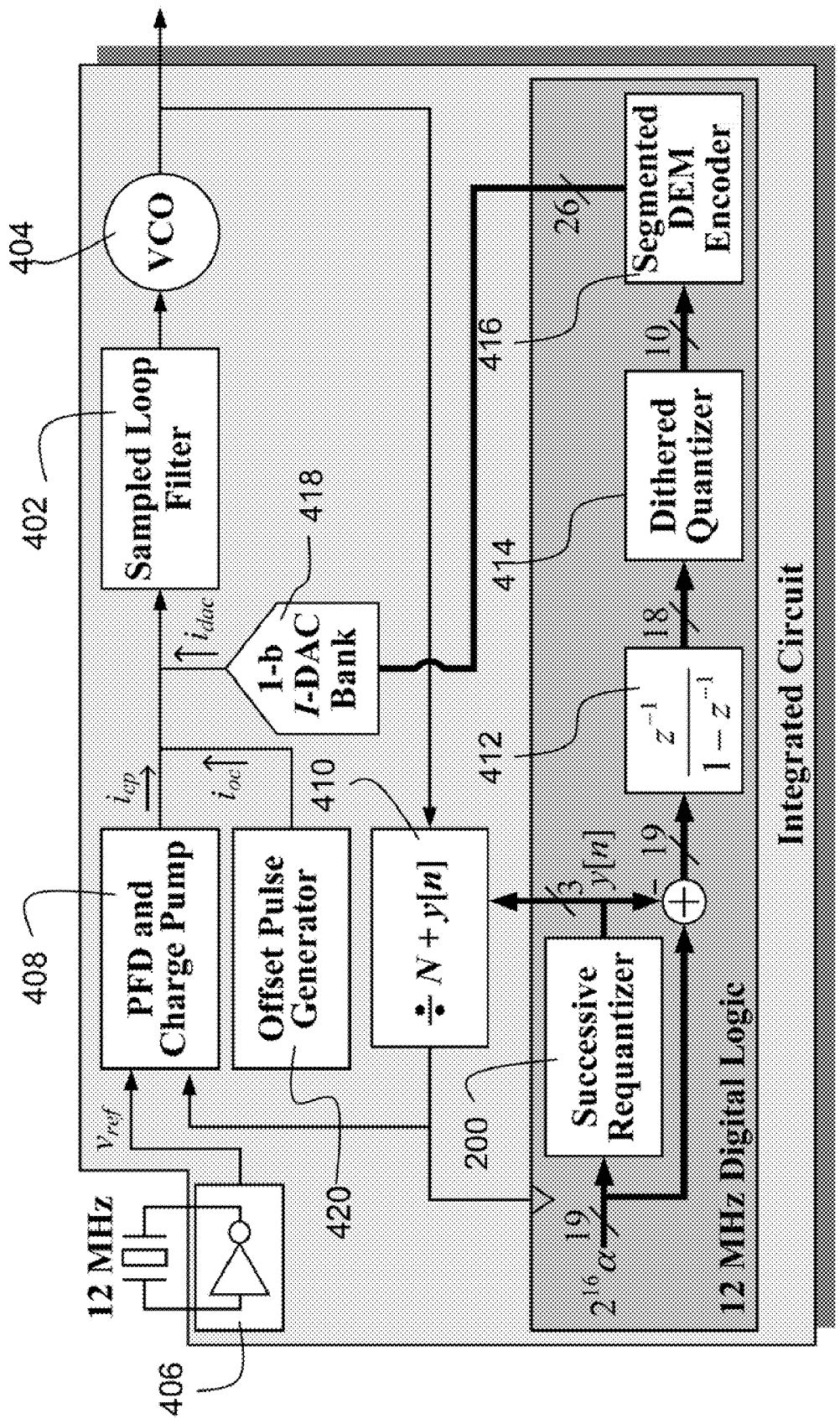
FIG. 4 is a block diagram of a preferred embodiment prototype fractional-N PLL or DAC.

FIG. 4 is a block diagram of an experimental prototype phase noise cancelling fractional-N PLL prototype in accordance with the invention. The prototpye's reference frequency was 12 MHz, and its output frequency range covered the 2.4 GHz ISM band. The phase noise cancellation enables a loop bandwidth of 975 kHz which is close to the $f_{ref}/10$ loop bandwidth upper limit for stability.

The FIG. 4 fractional-N PLL includes the successive requantizer 200 to that is shown in FIGS. 2A-3B and the remainder of the circuit preferably conducts adaptive phase noise cancellation as conducted by the preferred embodiments in the '293 application. The FIG. 4 fractional-N PLL includes a sampled loop filter 402 that drives a VCO 404, with preferred embodiments using a sampled loop filter having two separate loop filter halves that drive separate half-sized parallel varactors in the VCO 404 as in the '293 application. An amplifier 406 uses a 12 MHz crystal and supplies the reference clock voltage to a phase frequency detector/charge pump 408. The timing of pulses in the reference voltage and pulses received from the divider 410 determines whether the PFD/Charge pump will produce a positive or negative pulse of current to increase or decrease the VCO frequency. The successive requantizer 200 acts as discussed above to provide a sequence of values that average to a desired fractional value. A noise cancellation path including a filter 412, dithered quantizer 414, segmented DEM 416 encoder and DAC bank 418, discrete-time integrates the quantization noise to obtain a digital sequence and transform it via the DAC 202 into a current pulse of fixed duration and variable amplitude that equals the quantization noise portion of the charge in the corresponding charge pump pulse. A prototype integrated circuit in accordance with FIG. 4 also included alternate circuitry that could be enabled or disabled, including a $\Delta\Sigma$ modulator which could be optionally be used instead of the successive requantizer and an offset pulse generator 420 that can be enabled or disabled. In the IC prototype, the loop filter's sampling could be enabled or disabled, and when it was disabled, the loop filter reduces to a conventional loop filter.

The divider 410 is similar to the divider in the '293 application, except with minor changes to provide timing signals that control the offset current generator 418 and open the loop filter switch each reference period. As described in '293 application, the necessary timing signals are obtained by a chain of flip-flops clocked at half the VCO frequency. The timing signal used to close the loop filter switch each reference period could similarly have been derived within the divider block, but an RC one-shot circuit, timed from an output of the divider block, with a nominal duration of 25 ns was used in the prototype integrated circuit instead for simplicity because the length of time the switch is left open is not critical. Provided the switch is open when the loop filter's input current is non-zero, the PLL dynamics are relatively insensitive to the length of time it is open. Testing of the prototype with the successive requantizer, offset pulse generator, and sampled loop filter enabled and $\alpha$ chosen such that $\alpha f_{ref}$=50 kHz revealed fractional spurs well inside the 975 kHz loop bandwidth, but all below −70 dBc in power. Four copies of the IC were tested. Table 1 shows the worst-case measurements taken from the four ICs. An IC wiring mistake disabled the DAC calibration circuitry, so the measurements described above were made after a one-time manual adjustment of the DAC gain. To confirm the diagnosis of the mistake, it was corrected in one copy of the IC by FIB microsurgery, but with the anticipated side effect of a coupling path that increased the measured in-band phase noise, 3 MHz phase noise, and largest in-band fractional spur by 10 dB, 3 dB, and 3 dB, respectively, above those shown in Table 1.

| Design Details | | |
|---|---|---|
| Technology | 0.18 um 1P6M CMOS | |
| Package and Die area | 32 pin TQFN, 2.2 mm × 2.2 mm | |
| Vdd | 1.8 V | |
| Reference frequency | 12 MHz | |
| Output frequency | 2.4-2.5 GHz | |
| Measured loop bandwidth | 975 kHz | |
| Measured Current Consumption | | |
| VCO and Divider Buffer | 5.9 mA | Core |
| Divider | 7.3 mA | 27.1 mA |
| Charge Pump, PFD, and Buffers | 8.6 mA | |
| Offset Current | 0.6 mA | |
| Digital | 1.9 mA | |
| DAC | 2.8 mA | |
| Bandgap Bias Generator | 5.4 mA | 9.8 mA |
| Crystal Buffer | 2.7 mA | |
| External Buffer | 1.7 mA | |
| Measured Integer-N Performance | | |
| Phase Noise at 100 kHz | −103 dBc/Hz | |
| Phase Noise at 3 MHz | −125 dBc/Hz | |
| Reference spur without sampling enabled | −58 dBc | |
| Reference spur with sampling enabled | −70 dBc | |
| Measured Fractional-N Performance | | |
| Phase Noise at 100 kHz | −98 dBc/Hz | |
| Phase Noise at 3 MHz | −121 dBc/Hz | |
| Worst case in-band fractional spur with $\Delta\Sigma$ modulator | −45 dBc | |
| Worst case in-band fractional spur with SR | −64 dBc | |
| Reference spur without sampling enabled | −40 dBc | |
| Reference spur with sampling enabled | −70 dBc | |

Successive Requantization Proof

The restriction to first-order highpass shaped quantization noise discussed above still leaves flexibility in the design of the $s_d[n]$ sequences. This flexibility is exploited to ensure that $s^p[n]$ for p=1, 2, ..., $h_s$ and $t^p[n]$ for p=1, 2, ..., $h_t$ are free of spurious tones, where $h_s$ and $h_t$ are positive integers. By definition, if $s^p[n]$ and $t^p[n]$ contain spurious tones at a frequency $\omega_n$, then Equations (2) and (3) above, respectively, are expected to be unbounded in probability at $\omega=\omega_n$ as L>∞. Therefore, to establish that there are no spurious tones in either $s^p[n]$ or $t^p[n]$, it is sufficient to show that Equations (2) and (3) are bounded in probability for all $|\omega|\leq\pi$ as L→∞. A spurious tone at $\omega$=0 is just a constant offset. Many practical systems are able to tolerate, or compensate for this offset so this case is excluded from consideration. Theorems 1 and 2 below present sufficient conditions on the $s_d[n]$ sequences for (2) and (3) to be bounded in probability for every L≧1 and 0<$|\omega|\leq\pi$, thereby ensuring the absence of spurious tones in $s^p[n]$ and $t^p[n]$. First-order highpass quantization noise is achieved with quantization blocks that implement equation (11) above. Results imply that neither $s_d[n]$ nor $t_d[n]$ contain spurious tones. Therefore, s[n] and t[n] inherit these properties provided the $r_d[n]$ sequences for d=0, ..., K−1 are independent.

However, if the quantization noise or its running sum is subjected to non-linear distortion, spurious tones can be induced. The presence of spurious tones implies that subjecting t[n] to second-order distortion is sufficient to induce spurious tones even though t[n] is known to be free of spurious tones.

The spur generation mechanism can be understood by considering the first quantization block. Suppose the input to the successive requantizer is an odd-valued constant and $t_0[n-1]=0$ for some value of n. Then (11) implies that $(s_0[n], s_0[n+1])$ is either $(-1, 1)$ or $(1, -1)$ depending on the polarity of $P_0[n]$. It follows from (5) that $(t_0[n], t_0[n+1])$ is either $(-1, 0)$ or $(1, 0)$, and, by induction, $t_0[n]$ has the form $\{\ldots, 0, \pm 1, 0, \pm 1, 0, \pm 1, 0, \ldots\}$. Therefore, $t_0^2[n]$ has the form $\{\ldots, 0, 1, 0, 1, 0, 1, 0, \ldots\}$ which is periodic. A similar, but more involved analysis can be used to show that the $t_d^2[n]$ sequences for d>0 also contain periodic components. These periodic components cause the spurious tones.

For the purpose of illustrating the principle of successive requantization for tone free quantization sequences, the remainder of the description assumes that the input to the quantizer, $x_0[n]$, is an integer-valued and deterministic sequence for n=0, 1, ..., and that the successive requantizer is designed such that the following properties are satisfied:

Property 1: $x_{d+1}[n]=(s_d[n]+x_d[n])/2$ is integer-valued for n=0, 1, ..., and d=0, 1, ..., K-1.

Property 2: there exists a positive constant B such that $|t_d[n]| < B$, for n=0, 1, 2, ....

Property 3: $t_d[0]=0$, and $$t_d[n]=f(t_d[n-1], r_d[n], o_d[n]) \quad (12)$$

where $r_d[n]$, d=0, 1, ..., K-1, n=1, 2, ... } is a set of independent identically distributed (iid) random variables, and $$o_d[n] = x_d[n] \bmod 2 = \begin{cases} 1, & \text{if } x_d[n] \text{ is odd,} \\ 0, & \text{if } x_d[n] \text{ is even,} \end{cases} \quad (13)$$

is called the parity sequence of the $d^{th}$ quantization block. Furthermore, f(x, y, z) is a deterministic function which does not depend on n.

Property 2 guarantees first-order spectral shaping of the quantization error by ensuring that $t_d[n]$ takes on a finite number of values for all n. However it need not be an optimal bound on the quantization error of the successive requantizer. Relaxing this bound, and hence incurring more quantization error power, permits the removal of spurious tones under non-linearities.

Property 1 and the assumption that $x_0[n]$ is integer-valued imply that $s_d[n]$ is an even integer when $x_d[n]$ is even, and an odd integer otherwise. Therefore, (5) implies that $t_d[n]$ is integer-valued, and Property 2 further implies that it is restricted to a finite set of values. Let $T_1, T_2, \ldots, T_N$ denote these values. Therefore, the function, $f$, in Property 3 takes on values restricted to the set $\{T_1, T_2, \ldots, T_N\}$.

It follows from Properties 1, 2, and 3 that $x_{d+1}[n]$, $s_d[n]$, and $t_d[n]$, for d=0, 1, K-1, and n=1, 2, ..., depend only on the set of iid random variables $\{r_d[n], d=0, 1, \ldots, K-1, n=0, 1, 2, \ldots\}$ and the deterministic successive requantizer input sequence, $\{x_0[n], n=1, 2, \ldots\}$. Therefore, the sample description space of the underlying probability space is the set of all possible values of the random variables $\{r_d[n], d=0, 1, \ldots, K-1, \text{ and } n=0, 1, 2, \ldots\}$.

Equation (5) implies that $$s_d[n]=t_d[n]-t_d[n-1]. \quad (14)$$

Therefore, it follows from Property 1 that $$x_d[n]=t_{d-1}[n]-t_{d-1}[n-1]+x_{d-1}[n])/2, \quad (15)$$

for $1 \leq d < K$. Recursively substituting (15) into itself and applying (13) yields $$o_d[n] = \frac{1}{2}\left[x_0[n] + \sum_{k=0}^{d-1} 2^{-k}(t_k[n] - t_k[n-1])\right] \bmod 2. \quad (16)$$

Recursively substituting (12) into itself implies that for any integer n>0, $$t_d[n]=g_n(r_d[n], r_d[n-1], \ldots, r_d[1], o_d[n], o_d[n-1], \ldots, o_d[1]) \quad (17)$$

where $g_n$ is a deterministic, memoryless function. Similarly, for any pair of integers $n_2 > n_1 > 0$, recursively substituting (12) into itself $m=n_2-n_1-1$ times implies that $$t_d[n_2]=h_m(t_d[n_1], r_d[n_1+1], r_d[n_1+2], \ldots, r_d[n_2], o_d[n_1+1], o_d[n_1+2], \ldots, o_d[n_2]) \quad (18)$$

where $h_m$ is a deterministic, memoryless function.

Repeatedly substituting (16) into (17) to eliminate the variables $\{o_d[n], \ldots, o_d[1]\}$ and then recursively substituting the result into itself to eliminate the variables $\{t_k[m], k=0, \ldots, d-1, m=1, \ldots, n\}$ shows that $t_d[n]$ is a random variable that depends only on $x_0[n]$ (which is deterministic), and the random variables $\{r_k[m], k=0, 1, \ldots, d, m=1, 2, \ldots, n\}$. This in conjunction with (16) implies that $o_d[n]$ is a random variable that depends only on $x_0[n]$, and the random variables $\{r_k[m], k=0, 1, d-1, m=1, 2, n\}$. In particular, since the random sequence $\{o_d[n], n=0, 1, 2, \ldots\}$ does not depend on the random sequence $\{r_d[n], n=0, 1, 2, \ldots\}$ and since all the random variables $\{r_k[m] d=0, 1, \ldots, K-1, n=0, 1, 2, \ldots\}$ are statistically independent by Property 3, it follows that $\{o_d[n], n=0, 1, 2, \ldots\}$ and $\{r_d[n], n=0, 1, 2, \ldots\}$ are statistically independent random sequences. By similar reasoning, the random variable $t_d[n]$ is statistically independent of the random variables $\{r_d[m], m=n+1, n+2, \ldots\}$ Hence, (18) implies that $t_d[n_2]$ conditioned on the random variables $t_d[n_1]$, $o_d[n_1+1]$, $o_d[n_1+2]$, $o_d[n_2]$ is a function only of the statistically independent random variables $r_d[n_1]$, $r_d[n_1+1], \ldots, r_d[n_2]$. By definition, for $i \neq j$ the random variables $\{r_i[n_1], r_i[n_1+1], \ldots, r_i[n_2]\}$ are statistically independent of the random variables $\{r_j[n_1], r_j[n_1+1], \ldots, r_j[n_2]\}$. Therefore, for $i \neq j$ the random variables $t_i[n_2]$ and $t_j[n_2]$ and conditioned on $t_i[n_1]$, $t_j[n_1]$, $o_i[n_1+1]$, $o_i[n_1+2]$, ..., $o_i[n_2]$, $o_j[n_1+1]$, $o_j[n_1+2]$, ..., $o_j[n_2]$ are statistically independent. Consequently, for any positive real numbers $p_0, \ldots, p_{k-1}$, $$E\left[\prod_{j=0}^{K-1} t_j^{p_j}[n_2] \mid t_d[n_1], o_d[n];\right.$$
$$\left. d=0, \ldots, K-1, n=n_1+1, \ldots, n_2\right] =$$
$$\prod_{j=0}^{K-1} E\left[t_j^{p_j}[n_2] \mid t_d[n_1], o_d[n]; d=0, \ldots, K-1, n=n_1+1, \ldots, n_2\right] = \prod_{j=0}^{K-1} E\left[t_j^{p_j}[n_2] \mid t_j[n_1], o_j[n]; n=n_1+1, \ldots, n_2\right], \quad (19)$$

where the second equality follows from (12) and the independence of the $\{r_d[n], n=1, 2, \ldots,\}$ sequences for d=0, K-1.

This implies that the pmf of the random variable $t_i[n_2]$ conditioned on $t_i[n_1]$, $o_i[n_1+1]$, $o_i[n_1+2]$, ..., $o_i[n_2]$ is independent of any additional conditioning by and $t_j[n_1]$, $o_j[n_1+1]$, $o_j[n_1+2]$, ..., $o_j[n_2]$ for $i \neq j$.

The statistical independence of $o_d[n]$ and $r_d[n]$ together with (12) imply that $\{t_d[n], n=0, 1, \ldots\}$ is a discrete-valued Markov random sequence conditioned on the sequence $\{o_d[n], n=0, 1, \ldots\}$. Whenever $x_d[n]$ is odd the one-step state transition matrix for $t_d[n]$ is given by $$A_o = [r\{t_d[n]=T_j | t_d[n-1]=T_i, o_d[n]=1\}]_{N \times N}. \tag{20}$$

Similarly, whenever $x_d[n]$ is even the one-step state transition matrix for $t_d[n]$ is given by $$A_e = [P\{t_d[n]=T_j | t_d[n-1]=T_i, o_d[n]=0\}]_{N \times N}. \tag{21}$$

The function $f$ in Property 3 is independent of n and d, so neither matrix is a function of n and d.

Equation (14) implies that each possible value of $s_d[n]$ is given by $T_j - T_i$ for some pair of integers i and j, $1 \leq i, j \leq N$, so $$P\{s_d[n]=T_j-T_i | t_d[n-1]=T_i, o_d[n]=1\} = P\{t_d[n]=T_j | t_d[n-1]=T_i, o_d[n]=1\}. \tag{22}$$

Given that $t_d[n]$ is restricted to N possible values, $s_d[n]$ is restricted to N' possible values where $N' \leq N^2$. With identical reasoning to that used to proceed from (15) to (19), it follows that $$E\left[\prod_{j=0}^{K-1} s_j^{p_j}[n_2] \mid t_0[n_1], \ldots, t_{K-1}[n_1], \right.$$

$$\left. o_d[n]; d=0, \ldots, K-1, n=n_1+1, \ldots, n_2 \right] = \tag{23}$$

$$\prod_{j=0}^{K-1} E\left[ s_j^{p_j}[n_2] \mid t_j[n_1], o_j[n]; n=n_1+1, \ldots, n_2 \right].$$

Given that $\{t_d[n], n=0, 1, \ldots\}$ is a discrete-valued Markov random sequence conditioned on the sequence $\{o_d[n], n=0, 1, \ldots\}$, the conditional probability mass function (pmf) of $t_d[n_2]$ given $t_d[n_1]$ and $o_d[n]$ is equal to the conditional pmf of $t_d[n_2]$ given $t_d[n_1]$, $t_d[n_1-1]$ and $o_d[n]$. Therefore, (14) implies that (23) is equivalent to $$E\left[\prod_{j=0}^{K-1} s_j^{p_j}[n_2] \mid s_0[n_1], \ldots, s_{K-1}[n_1], t_0[n_1], \ldots, \right.$$

$$\left. t_{K-1}[n_1], o_d[n]; d=0, \ldots, K-1, n=n_1+1, \ldots, n_2 \right] = \tag{24}$$

$$\prod_{j=0}^{K-1} E\left[ s_j^{p_j}[n_2] \mid t_j[n_1], o_j[n]; n=n_1+1, \ldots, n_2 \right].$$

The following definitions are used by the theorems presented below. In analogy to the matrices $A_o$ and $A_e$, let $$S_o = [P\{s_d[n]=S_j | t_d[n-1]=T_i, o_d[n]=1\}]_{N \times N'}, \tag{25}$$

and $$S_e = [P\{s_d[n]=S_j | t_d[n-1]=T_i, o_d[n]=0\}]_{N \times N'}, \tag{26}$$

where $\{S_i, 1 \leq i \leq N'\}$ is the set of all possible values of sd[n]. Property 3 ensures that neither matrix is a function of n and d. It follows from (22) that each non-zero element of So or Se is equal to an element in Ao or Ae, respectively. For example, if $S_k = T_j - T_i$, then the element in the ith row and kth column of $S_o$ is equal to the element in the ith row and jth column of $A_o$. In this fashion, once $A_o$ and $A_e$ are known, $S_o$ and $S_e$ can be deduced.

Let $$1 \triangleq \begin{bmatrix} 1 \\ \vdots \\ 1 \end{bmatrix}, t^{(p)} \triangleq \begin{bmatrix} (T_1)^p \\ \vdots \\ (T_N)^p \end{bmatrix}, \text{ and } s^{(p)} \triangleq \begin{bmatrix} (S_1)^p \\ \vdots \\ (S_{N'})^p \end{bmatrix} \tag{27}$$

Suppose a sequence of vectors, $b[n] = [b_1[n], \ldots, b_N[n]]^T$ converges to a constant vector, b1, as $n \to \infty$. Then the convergence is said to be exponential if there exist constants $C \geq 0$ and $0 \leq \alpha < 1$ such that $$|b_i[n] - b| \leq C\alpha^n \tag{28}$$

for all $1 \leq i \leq N$ and $n \geq 0$.

Theorem 1: Suppose that the state transition matrices $A_e$ and $A_o$ satisfy $$A_e A_o = A_o A_e, \tag{29}$$

and there exists an integer $h_t \geq 1$ such that for each positive integer $p \leq h_t$ $$\lim_{n \to \infty} A_e^n t^{(p)} = b_p 1, \text{ and } \lim_{n \to \infty} A_o^n t^{(p)} = b_p 1 \tag{30}$$

where $b_p$ is a constant and the convergence of both vectors is exponential. Then for every $L \geq 1$, $$E[I_{t,L}^{p}{}^{(\omega)}] \leq C(\omega) < \infty \tag{31}$$

for each $0 < |\omega| \leq \pi$. Moreover, the bound $C(\omega)$, which is independent of L, is uniform in $\omega$ for all $0 < \epsilon < |\omega| \leq \pi$.

By Markov's Inequality, this immediately leads to:

Corollary 1: Under the assumptions of Theorem 1, $I_{t,L}^{p}{}^{(\omega)}$ is bounded in probability for all $L \geq 1$ and for each $\omega$ satisfying $0 < |\omega| \leq \pi$.

Proof of Theorem 1: The expectation of $I_{t,L}^{p}{}^{(\omega)}$ can be expressed as $$E[I_{tP,L}(\omega)] = \frac{1}{L} \sum_{n_1=0}^{L-1} \sum_{n_2=0}^{L-1} E[t^p[n_1] t^p[n_2]] e^{-j\omega(n_1-n_2)} \tag{32}$$

$$= \frac{1}{L} \sum_{n_1=0}^{L-1} E[t^{2p}[n]] +$$

$$\frac{1}{L} \sum_{\substack{n_1=0 \\ n_1 \neq n_2}}^{L-1} \sum_{n_2=0}^{L-1} E[t^p[n_1] t^p[n_2]] e^{-j\omega(n_1-n_2)} \triangleq J_1 + J_2.$$

The notation above means that $J_1$ and $J_2$ are defined as the first and second terms, respectively, to the left of the $\triangleq$ symbol. Property 2 states that $|t_d[n]| \leq B$, so it follows from (6) that $t[n] \leq B_1$ for some finite constant $B_1$. Therefore, $J_1 \leq B_1^{2p}$. The crux of the proof is showing that there exists a constant $C_P$, positive constants $D_1$, $D_2$, and a constant $0 < \alpha < 1$ such that for $n_1 \neq n_2$ $$|E[t^p[n_1] t^p[n_2]] - C_P| \leq D_1 \alpha^{|n_2 - n_1|} + D_2 \alpha^{n_1} \tag{33}$$

The proof of (33) is outlined in Lemma 1 in the proof of Lemmas given below. Here (33) is used to complete the proof of the theorem. From (32), $J_2$ can be expressed as $$J_2 = \frac{1}{L} \sum_{\substack{n_1=0 \\ n_1 \neq n_2}}^{L-1} \sum_{n_2=0}^{L-1} (E[t^p[n_1] t^p[n_2]] - C_{t^p}) e^{-j\omega(n_1-n_2)} + \frac{1}{L} \sum_{\substack{n_1=0 \\ n_1 \neq n_2}}^{L-1} \sum_{n_2=0}^{L-1} C_{t^p} e^{-j\omega(n_1-n_2)} \triangleq J_{2,1} + J_{2,2}. \quad (34)$$

From (33) it is seen that $$|J_{2,1}| \leq \frac{1}{L} \sum_{\substack{n_1=0 \\ n_1 \neq n_2}}^{L-1} \sum_{n_2=0}^{L-1} (D_1 \alpha^{|n_1-n_2|} + D_2 \alpha^{n_1}) \leq \quad (35)$$

$$\frac{D_1}{L} \sum_{n_1=0}^{L-1} \sum_{n_2=0}^{L-1} \alpha^{|n_1-n_2|} + D_2 \sum_{n_1=0}^{L-1} \alpha^{n_1} \leq$$

$$2(D_1+D_2) \frac{1-\alpha^L}{1-\alpha} \leq 2(D_1+D_2) \frac{1}{1-\alpha}.$$

and the bound is independent of L. Similarly, $J_{2,2}$ can be bounded by $$|J_{2,2}| \leq \frac{|C_{t^p}|}{L} \left| \left| \sum_{n=0}^{L-1} e^{-j\omega n} \right|^2 - L \right| \leq \frac{|C_{t^p}|}{L} \left| \left| \frac{1-e^{-j\omega L}}{1-e^{-j\omega}} \right|^2 - L \right| = \quad (36)$$

$$\frac{|C_{t^p}|}{L} \left| \left| \frac{\sin(\omega L/2)}{\sin(\omega/2)} \right|^2 - L \right| \cdot \leq |C_{t^p}| \left( 1 + \frac{1}{\sin^2(\omega/2)} \right)$$

which is finite, independent of L, for each $\omega$ satisfying $0 < |\omega| \leq \pi$; the bound is uniform for all $\omega$ satisfying $0 < \epsilon \leq |\omega| \leq \pi$ since $\sin(\omega/2) > \sin(\epsilon/2)$. The result of the theorem then follows from (32) through (36).

Theorem 2: Suppose that the state transition matrices $A_e$ and $A_o$ satisfy $$A_e A_o = A_o A_e, \quad (37)$$

and there exists an integer $h_s \geq 1$ such that for each positive integer $p \leq h_s$, the sequence transition matrices $S_e$ and $S_o$ satisfy $$\lim_{n \to \infty} A_e^n S_e s^{(p)} = \lim_{n \to \infty} A_e^n S_o s^{(p)} \quad (38)$$
$$= \lim_{n \to \infty} A_o^n S_e s^{(p)}$$
$$= \lim_{n \to \infty} A_o^n S_o s^{(p)}$$
$$= c_p \mathbf{1},$$

where cp is a constant and the convergence of all vectors are exponential. Then for every $L \geq 1$, $$E[I_{s^p,L}(\omega)] \leq D(\omega) < \infty \quad (39)$$

for each $0 << |\omega| \leq \pi$. Moreover, the bound $D(\omega)$, which is independent of L, is uniform in $\omega$ for all $0 < \epsilon < |\omega| < \pi$.

By Markov's Inequality, this immediately leads to,

Corollary 2: Under the assumptions of Theorem 2, $I_{s^p,L}(\omega)$ is bounded in probability for all $L \geq 1$ and for each $\omega$ satisfying $0 < |\omega| \leq \pi$.

Proof of Theorem 2: The proof is identical to that of Theorem 1. Replacing $t^p[n_1]$ and $t^p[n_2]$ with $s^p[n_1]$ and $s^p[n_2]$ respectively, the crux of the proof is showing that there exists a constant $C_{s^p}$, positive constants $E_1$, $E_2$, and a constant $0 < \beta < 1$ such that for $n_1 \neq n_2$ $$|E[s^p[n_1]s^p[n_2]] - C_{s^p}| \leq + E_1 \beta^{|n_2-n_1|} + E_2 \beta^{n_1}, \quad (40)$$

With (40) proven in Lemma 2 below, the remainder of the proof follows directly from Theorem 1.

Matrices $A_e$, $A_o$, $S_e$, and $S_o$ which can be used with the successive requantizer to generate quantized sequences and satisfy the conditions of Theorems 1 and 2 for $h_t=3$ and $h_s=5$ are presented are provided as an example.

For a state $t_d[n]$ whose possible values are $\{-2, -1, 0, 1, 2\}$, define $$t^{(p)} = [(-2)^p (-1)^p 0 \ 1^p \ 2^p]^T \quad (41)$$

and the proposed state transition matrices as $$A_o = \begin{bmatrix} 0 & 3/4 & 0 & 1/4 & 0 \\ 3/16 & 0 & 3/4 & 0 & 1/16 \\ 0 & 1/2 & 0 & 1/2 & 0 \\ 1/16 & 0 & 3/4 & 0 & 3/16 \\ 0 & 1/4 & 0 & 3/4 & 0 \end{bmatrix}; \quad (42)$$

and $$A_e = \begin{bmatrix} 1/4 & 0 & 3/4 & 0 & 0 \\ 0 & 5/8 & 0 & 3/8 & 0 \\ 1/8 & 0 & 3/4 & 0 & 1/8 \\ 0 & 3/8 & 0 & 5/8 & 0 \\ 0 & 0 & 3/4 & 0 & 1/4 \end{bmatrix}.$$

From (14) all possible $s_d[n]$ values are $\{-4, -3, -2, -1, 0, 1, 2, 3, 4\}$, and further define $$s^{(p)} = [(-4)^p (-3)^p (-2)^p (-1)^p 0 \ 1^p \ 2^p \ 3^p \ 4^p]^T. \quad (43)$$

Applying (22) yields $$S_o = \begin{bmatrix} 0 & 0 & 0 & 0 & 0 & 3/4 & 0 & 1/4 & 0 \\ 0 & 0 & 0 & 3/16 & 0 & 3/4 & 0 & 1/16 & 0 \\ 0 & 0 & 0 & 1/2 & 0 & 1/2 & 0 & 0 & 0 \\ 0 & 1/16 & 0 & 3/4 & 0 & 3/16 & 0 & 0 & 0 \\ 0 & 1/4 & 0 & 3/4 & 0 & 0 & 0 & 0 & 0 \end{bmatrix}, \quad (44)$$

and $$S_e = \begin{bmatrix} 0 & 0 & 0 & 0 & 1/4 & 0 & 3/4 & 0 & 0 \\ 0 & 0 & 0 & 0 & 5/8 & 0 & 3/8 & 0 & 0 \\ 0 & 0 & 1/8 & 0 & 3/4 & 0 & 1/8 & 0 & 0 \\ 0 & 0 & 3/8 & 0 & 5/8 & 0 & 0 & 0 & 0 \\ 0 & 0 & 3/4 & 0 & 1/4 & 0 & 0 & 0 & 0 \end{bmatrix}.$$

Multiplying the matrices in either order yields $$A_e A_o = A_o A_e = \begin{bmatrix} 0 & 9/16 & 0 & 7/16 & 0 \\ 9/64 & 0 & 3/4 & 0 & 7/64 \\ 0 & 1/2 & 0 & 1/2 & 0 \\ 7/64 & 0 & 3/4 & 0 & 9/64 \\ 0 & 7/16 & 0 & 9/16 & 0 \end{bmatrix}, \quad (45)$$

so the matrices commute. Direct computation reveals that the eigenvectors of both Ae and Ao are linearly independent, and therefore Ae and Ao are diagonalizable. Specifically, $A_e^n = V_e \lambda_e^n V_e^{-1}$, where $$\Lambda_e^n = \begin{bmatrix} 1 & 0 & 0 & 0 & 0 \\ 0 & 1/4^n & 0 & 0 & 0 \\ 0 & 0 & 0 & 0 & 0 \\ 0 & 0 & 0 & 1 & 0 \\ 0 & 0 & 0 & 0 & 1/4^n \end{bmatrix}, \quad (46)$$

$$V_e = \begin{bmatrix} 1 & 1 & 1 & 0 & 0 \\ 0 & 0 & 0 & 1 & -1 \\ 1 & 0 & -1/3 & 0 & 0 \\ 0 & 0 & 0 & 1 & 1 \\ 1 & -1 & 1 & 0 & 0 \end{bmatrix}, \text{ and}$$

$$V_e^{-1} = \begin{bmatrix} 1/8 & 0 & 3/4 & 0 & 1/8 \\ 1/2 & 0 & 0 & 0 & -1/2 \\ 3/8 & 0 & -3/4 & 0 & 3/8 \\ 0 & 1/2 & 0 & 1/2 & 0 \\ 0 & -1/2 & 0 & 1/2 & 0 \end{bmatrix},$$

and $A_o^n = V_o \lambda_o^n V_o^{-1}$, where $$\Lambda_o^n = \begin{bmatrix} (-1)^n & 0 & 0 & 0 & 0 \\ 0 & 1 & 0 & 0 & 0 \\ 0 & 0 & (-1/4)^n & 0 & 0 \\ 0 & 0 & 0 & 1/4^n & 0 \\ 0 & 0 & 0 & 0 & 0 \end{bmatrix}, \quad (47)$$

$$V_o = \begin{bmatrix} 1 & 1 & 1 & -1 & 1 \\ -1 & 1 & -1/2 & -1/2 & 0 \\ 1 & 1 & 0 & 0 & -1/3 \\ -1 & 1 & 1/2 & 1/2 & 0 \\ 1 & 1 & -1 & 1 & 1 \end{bmatrix},$$

and $$V_o^{-1} = \begin{bmatrix} 1/16 & -1/4 & 3/8 & -1/4 & 1/16 \\ 1/16 & 1/4 & 3/8 & 1/4 & 1/16 \\ 1/4 & -1/2 & 0 & 1/2 & -1/4 \\ -1/4 & -1/2 & 0 & 1/2 & 1/4 \\ 3/8 & 0 & -3/4 & 0 & 3/8 \end{bmatrix}.$$

By inspection of (46), $\lambda_e^n$ converges to $$\Lambda_{e,1} = \begin{bmatrix} 1 & 0 & 0 & 0 & 0 \\ 0 & 0 & 0 & 0 & 0 \\ 0 & 0 & 0 & 0 & 0 \\ 0 & 0 & 0 & 1 & 0 \\ 0 & 0 & 0 & 0 & 0 \end{bmatrix}, \quad (48)$$

The vector given by $V_e \lambda_{e,1} V_e^{-1} t^{(p)}$ is equal to $b_p \mathbf{1}$, where $b_p = 0$, 1 and 0 for $p = 1$, 2 and 3 respectively, which is of the form required by Theorem 1. To show exponential convergence, consider $$\|A_e^n t^{(p)} - b_p \mathbf{1}\| = \|(A_e^n - V_e \Lambda_{e,1} V_e^{-1}) t^{(p)}\| \le \|A_e^n - V_e \Lambda_{e,1} V_e^{-1}\| \|t^{(p)}\|, \quad (49)$$

where $\|\|$ is the $l_2$ norm, and $p = 1$, 2 or 3. Evaluating $\|t^{(p)}\|$ for $p = 3$, and $\|A_e^n - V_e \lambda_{e,1} V_e^{-1}\|$ yields $\sqrt{130}$ and $\sqrt{2}(1/4)^n$ respectively therefore the right side of (49) is equal to $$\sqrt{260}(1/4)^n \quad (50)$$

and therefore each element of the vector given by $A_e^n t^{(p)} - b_p \mathbf{1}$ converges exponentially to zero.

By inspection of (47), $\lambda_o^n$ does not converge, however it is sufficient to show that the vector $V_o \lambda_o^n V_o^{-1} t^{(p)}$ converges. Consider $A_o^n = V_o \zeta_{o,1}^n V_o^{-1} + V_o \lambda_{o,2}^n V_o^{-1}$ where $$\Lambda_{o,1}^n = \begin{bmatrix} 0 & 0 & 0 & 0 & 0 \\ 0 & 1 & 0 & 0 & 0 \\ 0 & 0 & (-1/4)^n & 0 & 0 \\ 0 & 0 & 0 & 1/4^n & 0 \\ 0 & 0 & 0 & 0 & 0 \end{bmatrix}, \quad (51)$$

and $$\Lambda_{o,2}^n = \begin{bmatrix} (-1)^n & 0 & 0 & 0 & 0 \\ 0 & 0 & 0 & 0 & 0 \\ 0 & 0 & 0 & 0 & 0 \\ 0 & 0 & 0 & 0 & 0 \\ 0 & 0 & 0 & 0 & 0 \end{bmatrix},$$

Multiplying $V_o \lambda_{o,2}^n V_o^{-1}$ by $t^{(p)}$ for $p = 1$, 2 or 3 results in a vector with all zero elements for all $n \ge 1$. Therefore, for all $n \ge 1$ and $p = 1$, 2 or 3, $A_o^n t^{(p)} = V_o \lambda_{o,1}^n V_o^{-1} t^{(p)}$. By inspection, $\zeta_{o,1}^n$ converges to $$\Lambda_{o,3} = \begin{bmatrix} 0 & 0 & 0 & 0 & 0 \\ 0 & 1 & 0 & 0 & 0 \\ 0 & 0 & 0 & 0 & 0 \\ 0 & 0 & 0 & 0 & 0 \\ 0 & 0 & 0 & 0 & 0 \end{bmatrix}, \quad (52)$$

The vector given by $V_o \lambda_{o,3} V_o^{-1} t^{(p)}$ is equal to $b_p \mathbf{1}$, where $b_p = 0$, 1 and 0 for $p = 1$, 2 and 3 respectively. Replacing $A_e^n, V_e, \lambda_{e,1}$, and $V_e^{-1}$ in (49) with $A_o^n, V_o, \lambda_{o,3}$, and $V_o^{-1}$ respectively shows that $\|A_o^n t^{(p)} - b_p \mathbf{1}\|$ converges exponentially to $b_p \mathbf{1}$. Therefore the state transition matrices given by (42) satisfy the conditions of Theorem 1 for $h_t = 3$.

Using the decomposition in (46) and (47) and the sequence transition matrices given by (44), it can be shown by direct computation that $A_o^n S_e s^{(p)}$, $A_o^n S_o s^{(p)}$, $A_e^n S_e s^{(p)}$ and $A_e^n S_o s^{(p)}$ converges to $c_p \mathbf{1}$, where $c_p = 0$, 1.5, 0, 6, and 0 for $p = 1$, 2, 3, 4 and 5 respectively. Furthermore, the convergence of each vector at index n can be bounded using (49), replacing $\|t^{(p)}\|$ alternately with $\|S_e s^{(p)}\|$ and $\|S_o s^{(p)}\|$, which implies that the convergence of $A_o{}^n S_e s^{(p)}$, $A_o{}^n S_o s^{(p)}$, $A_e{}^n S_e s^{(p)}$ and $A_e{}^n S_o s^{(p)}$ are exponential. Therefore, the matrices $A$., $A_o$, $S_e$, and $S_o$ given in (42) and (44) also satisfy the conditions of Theorem 2 for $h_s = 5$.

Proof of Lemmas 1 and 2

Lemma 1: Suppose the conditions of Theorem 1 are satisfied. Then there exists a constant $C_P$, positive constants $D_1$, $D_2$, and a constant $0 < \alpha < 1$ such that for $n_1 \neq n_2$ $$|E[t^p[n_1]t^p[n_2]] - C_p| \leq D_1 \alpha^{|n_2 - n_1|} + D_2 \alpha^{n_1} \tag{53}$$

Proof of Lemma 1: To establish (54), it suffices to assume that $n_2 > n_1$. Using (5), $E[t^p[n_2]t^p[n_1]]$ can be expressed as $$E[t^p[n_2]t^p[n_1]] = \sum_{c_1=0}^{K-1} \cdots \sum_{c_p=0}^{K-1} \sum_{d_1=0}^{K-1} \cdots \tag{54}$$

$$\sum_{d_p=0}^{K-1} 2^{c_1 + \ldots + c_p + d_1 + \ldots + d_p} E\left[\prod_{i=1}^{p} t_{c_i}[n_2] \prod_{j=1}^{p} t_{d_j}[n_1]\right].$$

It is seen that the above expression is a finite sum of terms of the form $$Q(n_1, n_2) = E\left[\prod_{j=0}^{K-1} \left(t_j^{p_j}[n_2] t_j^{q_j}[n_1]\right)\right], \tag{55}$$

where $p_j$ and $q_j$ are positive integers less than or equal to p. It thus suffices to establish a bound for $Q(n_1, n_2)$ of the form $$|Q(n_1, n_2) - C_3| \leq C_1 \alpha^{n_2 - n_1} + C_2 \alpha^{n_1}. \tag{56}$$

The right side of (55) is computed by conditional expectation as follows $$Q(n_1, n_2) = \tag{57}$$

$$E\left\{\prod_{i=0}^{K-1} t_i^{p_i}[n_1] E\left(\prod_{j=0}^{K-1} t_j^{q_j}[n_2] \bigg| t_d[n_1], o_d[n], d = 0, 1, \ldots, \right.\right.$$

$$\left.\left. K-1, n = n_1 + 1, \ldots, n_2\right)\right\}.$$

Substituting (19) into the inner conditional expectation of (57) yields $$Q(n_1, n_2) = \tag{58}$$

$$E\left\{\prod_{j=0}^{K-1} \left(t_j^{p_j}[n_1] E[t_j^{q_j}[n_2] \mid t_j[n_1], o_j[n], n = n_1 + 1, \ldots, n_2]\right)\right\}$$

Since $\{t_d[n], n = 0, 1, \ldots\}$ is a Markov process for any given parity sequence, $\{o_d[n] = o_{d,n}, n = 0, 1, \ldots\}$ where $o_{d,n} \in \{0, 1\}$, it follows from (20) and (21) that the m-step state transition matrix corresponding to $t_d[n]$ from time n to time n+m can be written as $$A_d[n, m] = \prod_{k=n+1}^{n+m} [A_o o_{d,k} + A_e(1 - o_{d,k})], \tag{59}$$

where $A_d[n, m]$ is an $N \times N$ matrix with elements of the form $$P\{t_d[n+m] = T_i | t_d[n] = T_j, o_d[n+1] = o_{d,n+1}, o_d[n+2] = o_{d,n+2}, \ldots, o_d[n+m] = o_{d,n+m}\}. \tag{60}$$

Since $o_{d,n}$ is either 1 or 0 for each n, (29) can be used to write (59) as $$A_d[n, m] = A_e^{y_m} A_o^{m - y_m} = A_o^{m - y_m} A_e^{y_m}, \tag{61}$$

$$\text{where } y_m = \sum_{k=n+1}^{n+m} o_{d,k}.$$

By definition, $y_m \geq m/2$ or $m - y_m \geq m/2$ depending on the given parity sequence. It follows from the exponential convergence of (30) that there exists positive numbers $C_{p,e}$ and $C_{p,o}$ positive numbers $\alpha_{p,e}$ and $\alpha_{p,o}$ and less than unity such that each element of $$A_e^{y_m} t^{(p)} - b_p 1 \tag{62}$$

is less than $C_{p,e} \alpha_{p,o}^{m/2}$ for $y_m \geq m/2$, and each element of $$A_o^{m - y_m} t^{(p)} - b_p 1 \tag{63}$$

is less than $C_{p,o} \alpha_{p,o}^{m/2}$ for $m - y_m \geq m/2$.

The matrices $A_o^{m - y_m}$ and $A_e^{y_m}$ are stochastic matrices, so $A_o^{m - y_m} 1 = 1$, $A_e^{y_m} 1 = 1$ and $$A_o^{m - y_m}(A_e^{y_m} t(p) - b_p 1) = A_o^{m - y_m} A_e^{y_m} t(p) - b_p 1, \tag{64}$$

$$A_e^{y_m}(A_o^{m - y_m} t(p) - b_p 1) = A_e^{y_m} A_o^{m - y_m} t(p) - b_p 1, \tag{65}$$

Since the elements of the vectors in (62) and (63) are exponentially bounded, the same must be true for the vectors in (64) and (65). From (61) it follows that the right side of either (64) or (65) is equal to $$A_d[n, m] t^{(p)} - b_p 1. \tag{66}$$

Therefore, in general each element of (66) has a magnitude less than $C \alpha^{m/2}$ where $C = \max\{C_{p,e}, C_{p,o}\}$ and $\alpha = \max\{\alpha_{p,e}, \alpha_{p,o}\}$, which implies that $$E[t_d^p[n+m] | t_d[n], o_d[n+j] = o_{d,n+j}, j = 1, \ldots, m] \to b_p \tag{67}$$

as $m \to \infty$ uniformly in n where the convergence is also exponential. This result is independent of the given deterministic sequence $\{o_{d,n}, n = 0, 1, \ldots\}$, so it implies that $$E[t_d^p[n+m] | t_d[n], o_d[n+j], j - 1, \ldots, m] \to b_p \tag{68}$$

almost surely as $m \to \infty$ uniformly in n where the convergence is also exponential.

Thus, the inner conditional expectation in (58) converges exponentially to $b_{r_j}$ as $n_2 - n_1 \to \infty$ with probability one so that $$Q(n_1, n_2) \to \prod_{j=0}^{K-1} b_{q_j} E\left\{\prod_{i=0}^{K-1} t_i^{p_i}[n_1]\right\}. \tag{69}$$

More precisely, the exponential convergence of (69) implies that for every $n_2 > n_1$ $$|E[t_j^{q_j}[n_2]t_j[n_1], o_j[n], n = n_1 + 1, \ldots, n_2] b_{q_j}| \leq C(q_j) \alpha^{n_2 - n_1}. \tag{70}$$

with probability one where $C(q_j)$ is a constant that depends on $q_j$. For every $n_2 > n_1$ $$\left| Q(n_1, n_2) - \prod_{j=0}^{K-1} b_{q_j} E\left\{ \prod_{i=0}^{K-1} t_i^{p_i}[n_1] \right\} \right| \leq E\left\{ \prod_{j=0}^{K-1} |t_j[n_1]|^{p_j} \right. \tag{71}$$

$$\left. \left| E[t_j^{q_j}[n_2] \mid t_j[n_1], o_j[n], n = n_1+1, \ldots, n_2] - b_{q_j} \right| \right\} \leq$$

$$\prod_{j=0}^{K-1} C(q_j) B^{p_j} \alpha^{n_2-n_1} \triangleq C_1 \alpha^{n_2-n_1}$$

where B is given from Property 2. By similar reasoning, it can be established that $$\left| E\left\{ \prod_{j=0}^{K-1} t_j^{q_j}[n_1] \right\} - \prod_{j=0}^{K-1} b_{q_j} \right| \leq C_2 \alpha^{n_1} \tag{72}$$

Hence, the above two bounds imply there exist positive constants $C_1$ and $C_2$ such that for all $n_2 > n_1$ $$\left| Q(n_1, n_2) - \prod_{i=0}^{K-1} b_{p_i} \prod_{j=0}^{K-1} b_{q_j} \right| \leq \left| Q(n_1, n_2) - E\left\{ \prod_{i=0}^{K-1} t_i^{p_i}[n_1] \right\} \prod_{j=0}^{K-1} b_{q_j} \right| + \tag{73}$$

$$\left| E\left\{ \prod_{i=0}^{K-1} t_i^{p_i}[n_1] \right\} \prod_{j=0}^{K-1} b_{q_j} - \prod_{i=0}^{K-1} b_{p_i} \prod_{j=0}^{K-1} b_{q_j} \right| \leq C_1 \alpha^{n_2-n_1} + C_2 \alpha^{n_1}.$$

Consequently, there exists a constant $C_3$ such that $$|Q(n_1,n_2) - C_3| \leq C_1 \alpha^{n_2-n_1} + C_2 \alpha^{n_1} \tag{74}$$

which is of the required form.

Lemma 2: Suppose the conditions of Theorem 2 are satisfied. Then there exists a constant $C_{s^p}$, positive constants $E_1$, $E_2$, and a constant $0 < \beta < 1$ such that for $n_1 \neq n_2$ $$|E[s^p[n_1]s^p[n_2] - C_{s^p}]| \leq E_1 \beta^{|n_2-n_1|} + E_2 \beta^{n_1} \tag{75}$$

Proof of Lemma 2: The proof is similar to that of Lemma 1, so only the non-trivial differences with respect to the proof of Lemma 1 are presented.

Similarly to the proof of Lemma 1, it is necessary to show that $$E[s_d^p[n+m]|t_d[n], o_d[n+j], j=1,\ldots,m] \to c_p \tag{76}$$

almost surely as $m \to \infty$ uniformly in n where the convergence is also exponential. With this result and $s_d[n]$, $c_p$, and (24) playing the roles of $t_d[n]$, $b_p$, and (19) in the proof of Lemma 1, respectively, the proof of Lemma 2 is almost identical that of Lemma 1. Therefore, it is sufficient to prove (76).

Since the random variables $t_d[n-1]$ and $o_d[n]$ are statistically independent, for any given parity sequence, $\{o_d[n] = o_{d,n}, n = 0, 1, \ldots\}$ where $o_{d,n} \in \{0,1\}$, it follows from (25), (26), and (60) that $$S_d[n,m+1] = A_d[n,m][S_o o_{d,n+m+1} + S_e(1-o_{d,n+m+1})] \tag{77}$$

where $S_d[n, m+1]$ is an N×N' matrix with elements of the form $$P\{s_d[n+m+1] = S_j | t_d[n] = T_i, o_d[n+1] = o_{d,n+1}, \ldots, o_d[n+m+1] = o_{d,n+m+1}\}, \tag{78}$$

where i is the row index and j is the column index. By similar reasoning to that used in the proof of Lemma 1, (37) and (38) together imply that there exists a positive number D and a positive number $\beta$ less than unity such that each element of the vector $$S_d[n,m+1]s^{(p)} - c_p 1, \tag{79}$$

has a magnitude less than $D \cdot \beta^{m/2}$. Thus, (79) implies that $$E[s_d^p[n+m]|t_d[n], o_d[n+j] = o_{d,n+j}, j=1,\ldots,m] \to c_p \tag{80}$$

as $m \to \infty$ uniformly in n where the convergence is also exponential. This result is independent of the given deterministic sequence $\{o_{d,n}, n = 0, 1, \ldots\}$, so it implies that (76) holds almost surely as $m \to \infty$ uniformly in n where the convergence is also exponential.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A successive requantizer device comprising:
   a plurality of quantization stages that each accept an input sequence and quantize the input sequence by a predetermined number of bits; wherein
   each quantization stage generates a quantization sequence $s_d[n]$, with the property that $x_d[n] + s_d[n]$ is an even number for each n, where $x_d[n]$ is the quantization stage's input sequence; and
   each quantization stage adds $s_d[n]$ to $x_d[n]$.

2. The device of claim 1, wherein each quantization stage discards a predetermined number of least significant bits to implement the quantization.

3. The device of claim 1, wherein each quantization stage simultaneously divides its input by $2^b$ and quantizes the result by b bits every sample period 4. The device of claim 3, wherein each quantization stage simultaneously halves its input and quantizes the result by one bit every sample period.

5. The device of claim 1, wherein numbers within the successive requantizer device are integers with a two's-compliment binary number representation at each time n, and at each quantization stage $s_d[n]$ is chosen such that $x_d[n] + s_d[n]$ does not exceed the range of a (K−d)-bit two's complement integer, and the parity of $s_d[n]$ is the same as that of $x_d[n]$, where K is determined by the number of quantization stages, the number of bits quantized per stage, and the logic which generates $s_d[n]$.

6. The device of claim 1, wherein that the running sum of each $s_d[n]$ sequence, i.e., $$t_d[n] = \sum_{k=0}^{n} s_d[k],$$

is bounded for all n, and each $s_d[n]$ has a smooth power spectral density that increases monotonically with frequency.

7. The device of claim 6, wherein $t_d[n]$ is a discrete-valued Markov random sequence conditioned on the parity of $x_d[n]$.

8. The device of claim 6, wherein $t_d[n]$ is a random process whose autocorrelation function converges to a constant as its time spread increases.

9. The device of claim 6, wherein each quantization stage calculates $s_d[n]$ as a function the running sum of $t_d[n]$ in addition to $t_d[n]$, an independent random sequence, and the parity of $x_d[n]$.

10. The device of claim 6, wherein each quantization stage calculates $s_d[n]$ as a function of the previous value of $t_d[n]$, the parity of the current value of $x_d[n]$, and the current value of an independent random sequence.

11. The device of claim 1, wherein each quantization stage implements $$s_d[n] = \begin{cases} 0, & \text{if } x_d[n] = \text{even} \\ p_d[n], & \text{if } x_d[n] = \text{odd and } t_d[n-1] = 0, \\ 1, & \text{if } x_d[n] = \text{odd and } t_d[n-1] = -1, \\ -1, & \text{if } x_d[n] = \text{odd and } t_d[n-1] = 1, \end{cases}$$

can be used, where $p_d[n]$ is an independent random sequence that takes on the values 1 and −1 with equal probability.

12. The device of claim 1, wherein that the running sums of each $t_{d,i}[n]$ sequence, i.e., $$t_{d,i}[n] = \sum_{k=0}^{n} t_{d,i-1}[k], \quad t_{d,1}[n] = \sum_{k=0}^{n} t_d[n]$$

are bounded for all n, and each $t_{d,i}[n]$ has a smooth power spectral density that increases monotonically with frequency.

13. A fractional-N PLL device, comprising:
a phase lock loop generating an output frequency from a voltage controlled oscillator based upon a low frequency reference voltage; and
a successive requantizer according to claim 1 for providing a sequence of integers to control a divider in the phase locked loop to settle to a desired fractional value.

14. The fractional-N PLL device of claim 12, further comprising an adaptive phase noise cancellation path.

15. A successive requantizer device comprising:
a plurality of quantization stages that each accept an input sequence and quantize the input sequence by a predetermined number of bits; wherein
each quantization stage adds a quantization sequence to the quantization stage's input sequence and the quantization sequence is a discrete-valued Markov random sequence conditioned on the parity of the input sequence.

16. A successive requantizer device comprising:
a plurality of quantization stages that each accept an input sequence and quantize the input sequence by a predetermined number of bits; wherein
each quantization stage adds a quantization sequence to the quantization stage's input sequence and the quantization sequence is random process whose autocorrelation function converges to a constant as its time spread increases.

* * * * *

UNITED STATES PATENT AND TRADEMARK OFFICE
CERTIFICATE OF CORRECTION

| | | |
|---|---|---|
| PATENT NO. | : 7,986,250 B2 | Page 1 of 4 |
| APPLICATION NO. | : 12/579899 | |
| DATED | : July 26, 2011 | |
| INVENTOR(S) | : Ian Galton et al. | |

It is certified that error appears in the above-identified patent and that said Letters Patent is hereby corrected as shown below:

On the Patent Face:

(56)     References Cited

OTHER PUBLICATIONS (Continued on Page 2)     Left column, line 18, please delete "Jul. 1957." and insert --Jul. 1987-- therefor.

In the Specification:

| | |
|---|---|
| Col. 1, line 62 | After "positive integer," delete "a" and insert --α-- therefor. |
| Col. 2, line 10 | After "voltage" delete ";" and insert --,-- therefor. |
| Col. 2, line 12 | Delete "$V_{d|v}$" and insert --$V_{div}$-- therefor. |
| Col. 2, line 18 | Delete "a" and insert --α-- therefor. |
| Col. 2, line 22 | Delete "a" and insert --α-- therefor. |
| Col. 5, line 48 | After "design" delete "a" and insert --α-- therefor. |
| Col. 5, line 49 | After "Therefore," delete "a" and insert --α-- therefor. |
| Col. 7, line 45 | Delete "$A_e = [P\{t_d[n] = T_j | t_d[n-1] = T_i, o_d[n] = 0\}]_{5 \times 5}$" and insert --$\mathbf{A}_e = \left[ P\{t_d[n] = T_j \,|\, t_d[n-1] = T_i, o_d[n] = 0\} \right]_{5 \times 5}$-- therefor. |
| Col. 8, line 14 | After "function" insert --of--. |
| Col. 9, line 13 | After "200" delete "to". |
| Col. 9, line 38 | Between "could" and "optionally" delete "be". |
| Col. 10, line 48 | After "$s^p[n]$ for" delete "p=1, 2,..., h," and insert --$p = 1, 2, ..., h_s$,-- therefor. |
| Col. 10, line 52 | Delete "L>∞" and insert --$L \to \infty$-- therefor. |

Signed and Sealed this

Seventeenth Day of January, 2012

David J. Kappos
*Director of the United States Patent and Trademark Office*

CERTIFICATE OF CORRECTION (continued)
U.S. Pat. No. 7,986,250 B2

| | |
|---|---|
| Col. 12, line 2 | Delete "$x_d[n]=t_{d-1}[n]-t_{d-1}[n-1]+x_{d-1}[n])/2,$" and insert -- $x_d[n]=(t_{d-1}[n]-t_{d-1}[n-1]+x_{d-1}[n])/2$ ,-- therefor. |
| Col. 12, lines 31-32 | Delete "$\{r_k[m], k=0, 1, d-1, m=1, 2, n\},$" and insert -- $\{r_k[m], k = 0, 1, ..., d-1, m = 1, 2, ..., n\}$ -- therefor. |
| Col. 12, line 42 | Delete "$t_d[n_1], o_d[n_1+1], o_d[n_1+2], o_d[n_2]$" and insert -- $t_d[n_1], o_d[n_1+1], o_d[n_1+2], ..., o_d[n_2]$ -- therefor. |
| Col. 12, line 47 | After "$t_i[n_2]$" delete "and". |
| Col. 12, line 67 | Delete "$d=0, K-1$" and insert -- $d = 0, ..., K - 1$ -- therefor. |
| Col. 13, line 2 | Delete "$t_i[n_1], o_i[n_1+1], o_i[n_1+2], ..., o_i[n_2]$" and insert -- $t_i[n_1], o_i[n_1+1], o_i[n_1+2], ..., o_i[n_2]$ -- therefor. |
| Col. 13, line 4 | Delete "$o_i[n_1+2], ..., o_i[n_2]$" and insert -- $o_i[n_1+2], ..., o_i[n_2]$ --. |
| Col. 13, line 10 | Delete "$A_o=[P\{t_d[n]=T_j|t_d[n-1]=T_i, o_d[n]=1\}]_{N \times N},$" and insert -- $\mathbf{A}_o = \left[ P\{t_d[n]= T_j \,|\, t_d[n-1]= T_i, o_d[n]=1\}\right]_{N \times N}$ -- therefor. |
| Col. 13, line 19 | Delete "$T_j-T_i$" and insert -- $T_j-T_i$ -- therefor. |
| Col. 13, line 64 | Delete "$S_e[P\{s_d[n]=S_j|t_d[n-1]=T_i, o_d[n]=0\}]_{N \times N'},$" and insert -- $\mathbf{S}_e = \left[P\{s_d[n]= S_j \,|\, t_d[n-1]=T_i, o_d[n]=0\}\right]_{N \times N'}$ -- therefor. |
| Col. 14, line 66 | Delete "$|E[t^p[n_1]t^p[n_2]-C_{t^p}]| \leq D_1 \alpha^{|n_2-n_1|}+D_2 \alpha^{11}$" and insert -- $|E[t^p[n_1]t^p[n_2] - C_{t^p}]| \leq D_1 \alpha^{|n_2-n_1|} + D_2 \alpha^{n_1}$ -- therefor. |
| Col. 15, line 41 | Delete "0<ω|≦π" and insert --$0 < |\omega| \leq \pi$-- therefor. |
| Col. 15, line 42 | Delete "0<ϵ<|ω|≦π" and insert --$0 < \varepsilon < |\omega| \leq \pi$-- therefor. |
| Col. 15, line 42 | Delete "sin(ω/2)>sin(ϵ/2)" and insert --sin(ω/2) > sin(ε/2)-- therefor. |
| Col. 15, line 66 | Delete "0<<|ω|≦π" and insert --$0 < |\omega| \leq \pi$-- therefor. |
| Col. 15, line 67 | Delete "0<ϵ<|ω|<π" and insert --$0 < \varepsilon < |\omega| \leq \pi$-- therefor. |

CERTIFICATE OF CORRECTION (continued)
U.S. Pat. No. 7,986,250 B2

| | |
|---|---|
| Col. 16, line 12 | Delete "$\|E[s^p[n_1]s^p[n_2]-C_{s^p}]\| \leqq + E_1\beta^{\|n2-n1\|} + E_2\beta^{n1}$," and insert -- $\left\|E\left[s^p[n_1]s^p[n_2]-C_{s^p}\right]\right\| \leq E_1\beta^{\|n_2-n_1\|} + E_2\beta^{n_1}$ -- therefor. |
| Col. 16, line 19 | After "presented" delete "are" and insert --and-- therefor. |
| Col. 17, line 15 | Delete "$A_e^n = V_e\lambda_e^n V_e^{-1}$" and insert -- $A_e^n = V_e\Lambda_e^n V_e^{-1}$ -- therefor. |
| Col. 17, line 40 | Delete "$A_o^n = V_o\lambda_o^n V_o^{-1}$" and insert -- $A_o^n = V_o\Lambda_o^n V_o^{-1}$ -- therefor. |
| Col. 18, line 1 | Delete "$\lambda_e^n$" and insert -- $\Lambda_e^n$ -- therefor. |
| Col. 18, line 11 | Delete "$V_e\lambda_{e,1}V_e^{-1}t^{(p)}$" and insert -- $V_e\Lambda_{e,1}V_e^{-1}t^{(p)}$ -- therefor. |
| Col. 18, line 21 | Delete "$\|A_e^n - V_e\lambda_{e,1}V_e^{-1}\|$" and insert -- $\|A_e^n - V_e\Lambda_{e,1}V_e^{-1}\|$ -- therefor. |
| Col. 18, line 26 | Delete "$\lambda_o^n$" and insert -- $\Lambda_o^n$ -- therefor. |
| Col. 18, line 27 | Delete "$V_o\lambda_o^n V_o^{-1}t^{(p)}$" and insert -- $V_o\Lambda_o^n V_o^{-1}t^{(p)}$ -- therefor. |
| Col. 18, line 28 | Delete "$A_o^n = V_o\zeta_{o,1}^n V_o^{-1} + V_o\lambda_{o,2}^n V_o^{-1}$" and insert -- $A_o^n = V_o\Lambda_{o,1}^n V_o^{-1} + V_o\Lambda_{o,2}^n V_o^{-1}$ -- therefor. |
| Col. 18, line 46 | Delete "$V_o\lambda_{o,2}^n V_o^{-1}$" and insert -- $V_o\Lambda_{o,2}^n V_o^{-1}$ -- therefor. |
| Col. 18, line 48 | Delete "$A_o^n t^{(p)} = V_o\lambda_{o,1}^n V_o^{-1}t^{(p)}$" and insert -- $A_o^n t^{(p)} = V_o\Lambda_{o,1}^n V_o^{-1}t^{(p)}$ -- therefor. |
| Col. 18, line 49 | Delete "$\zeta_{o,1}^n$" and insert -- $\Lambda_{o,1}^n$ -- therefor. |
| Col. 18, line 58 | Delete "$V_o\lambda_{o,3}V_o^{-1}t^{(p)}$" and insert -- $V_o\Lambda_{o,3}V_o^{-1}t^{(p)}$ -- therefor. |
| Col. 18, lines 59-60 | Delete "$A_e^n, V_e, \lambda_{e,1}$" and insert -- $A_e^n, V_e, \Lambda_{e,1}$ -- therefor. |
| Col. 18, line 60 | Delete "$A_o^n, V_o, \lambda_{o,3}$" and insert -- $A_o^n, V_o, \Lambda_{o,3}$ -- therefor. |
| Col. 19, line 5 | Delete "$A_e$" and insert --$A_e$-- therefor. |
| Col. 19, line 13 | Delete "$\|E[t^p[n_1]t^p[n_2]-C_{t^p}]\| \leqq D_1\alpha^{\|n2-n1\|} + D_2\alpha^{n1}$" and insert -- $\left\|E\left[t^p[n_1]t^p[n_2]-C_{t^p}\right]\right\| \leq D_1\alpha^{\|n_2-n_1\|} + D_2\alpha^{n_1}$ -- therefor. |

CERTIFICATE OF CORRECTION (continued)
U.S. Pat. No. 7,986,250 B2

| | |
|---|---|
| Col. 19, line 39 | Delete "$\|Q(n_1,n_2)-C_3\| \leq C_1 \alpha^{n_2-n_1} + C_2 \alpha^{n_1}$." and insert -- $\|Q(n_1,n_2)-C_3\| \leq C_1 \alpha^{n_2-n_1} + C_2 \alpha^{n_1}$ -- therefor. |
| Col. 20, line 8 | Delete "$P\{t_d[n+m]=T_j\|t_d[n]=T_i, o_d[n+1]=o_{d,n+1}, o_d[n+2]=o_{d,n+2},\ldots,o_d[n+m]=o_{d,n+m}\}$," and insert -- $P\{t_d[n+m]=T_j\|t_d[n]=T_i, o_d[n+1]=o_{d,n+1}, o_d[n+2]=o_{d,n+2},\ldots,o_d[n+m]=o_{d,n+m}\}$ -- therefor. |
| Col. 20, line 23 | Before "positive" insert --and--. |
| Col. 20, line 23 | After "$\alpha_{p,o}$" delete "and". |
| Col. 20, line 27 | Delete "$C_{p,e} \alpha_{p,e}^{m/2}$" and insert -- $C_{p,e} \alpha_{p,e}^{m/2}$ -- therefor. |
| Col. 20, line 33 | Delete "$A_e^{\gamma_m}(A_o^{m-\gamma_m} t^{(p)}) - b_p 1) = A_e^{\gamma_m} A_o^{m-\gamma_m} t^{(p)}) - b_p 1$," and insert -- $A_o^{m-\gamma_m}(A_e^{\gamma_m} t^{(p)} - b_p 1) = A_o^{m-\gamma_m} A_e^{\gamma_m} t^{(p)} - b_p 1$ -- therefor. |
| Col. 20, line 35 | Delete "$A_e^{\gamma_m}(A_o^{m-\gamma_m} t^{(p)}) - b_p 1) = A_e^{\gamma_m} A_o^{m-\gamma_m} t^{(p)}) - b_p 1$," and insert -- $A_e^{\gamma_m}(A_o^{m-\gamma_m} t^{(p)} - b_p 1) = A_e^{\gamma_m} A_o^{m-\gamma_m} t^{(p)} - b_p 1$ -- therefor. |
| Col. 20, line 52 | Delete "$E[t_d^p[n+m]\|t_d[n],o_d[n+j], j=1,\ldots,m] \to b_p$" and insert -- $E\left[t_d^p[n+m]\|t_d[n],o_d[n+j], j=1,\ldots,m\right] \to b_p$ -- therefor. |
| Col. 20, line 66 | Delete "$\|E[t_j^{q_j}[n_2]\|t_j[n_1],o_j[n],n=n_1+1,\ldots,n_2]b_{q_j}\| \leq C(q_j) \alpha^{n_2-n_1}$." and insert -- $\left\|E\left[t_j^{q_j}[n_2]\|t_j[n_1],o_j[n],n=n_1+1,\ldots,n_2\right] - b_{q_j}\right\| \leq C(q_j) \alpha^{n_2-n_1}$ -- therefor. |
| Col. 21, line 1 | Delete "$C(q_i)$" and insert -- $C(q_j)$ -- therefor. |
| Col. 21, line 44 | Delete "$\|E[s^p[n_1]s^p[n_2]-C_{s^p]}\| \leq E_1 \beta^{\|n_2-n_1\|} + E_2 \beta^{n_1}$," and insert -- $\left\|E\left[s^p[n_1]s^p[n_2] - C_{s^p}\right]\right\| \leq E_1 \beta^{\|n_2-n_1\|} + E_2 \beta^{n_1}$ -- therefor. |
| In the Claims: | |
| Col. 22, line 42 | After "sample period" insert a --,--. |
| Col. 23, line 5 | After "function" insert --of--. |
| Col. 24, line 28 | After "sequence is" insert --a--. |